US012658404B2

(12) United States Patent (10) Patent No.: US 12,658,404 B2
Futakuchi (45) Date of Patent: *Jun. 16, 2026

(54) ION IMPLANTER AND ION IMPLANTATION METHOD

(71) Applicant: SUMITOMO HEAVY INDUSTRIES ION TECHNOLOGY CO., LTD., Tokyo (JP)

(72) Inventor: Taisei Futakuchi, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 42 days.

This patent is subject to a terminal disclaimer.

(21) Appl. No.: 18/801,898

(22) Filed: Aug. 13, 2024

(65) Prior Publication Data

US 2024/0404785 A1 Dec. 5, 2024

Related U.S. Application Data

(63) Continuation of application No. 17/584,287, filed on Jan. 25, 2022, now Pat. No. 12,094,685.

(30) Foreign Application Priority Data

Jan. 27, 2021 (JP) ................................. 2021-011479

(51) Int. Cl.
 *H01J 37/302* (2006.01)
 *H01J 37/317* (2006.01)
 *H10P 30/20* (2026.01)

(52) U.S. Cl.
 CPC ...... *H01J 37/3023* (2013.01); *H01J 37/3171* (2013.01); *H10P 30/20* (2026.01)

(58) Field of Classification Search
 CPC ............... H01J 37/3023; H01J 37/3171; H01J 2237/04735; H01J 2237/30472; H01J 37/304; H01J 37/12; H01L 21/265; H05H 9/00
 See application file for complete search history.

(56) References Cited

U.S. PATENT DOCUMENTS

| | | | |
|---|---|---|---|
| 6,242,747 B1 | 6/2001 | Sugitani et al. | |
| 6,653,643 B2 | 11/2003 | Saadatmand et al. | |
| 10,283,422 B2 | 5/2019 | Kariya et al. | |

(Continued)

FOREIGN PATENT DOCUMENTS

| | | |
|---|---|---|
| JP | 3448731 B2 | 9/2003 |
| JP | 2004-524651 A | 8/2004 |
| JP | 2018-085179 A | 5/2018 |

(Continued)

*Primary Examiner* — Abdullah A Riyami
*Assistant Examiner* — Syed M Kaiser
(74) *Attorney, Agent, or Firm* — Michael Best & Friedrich LLP

(57) ABSTRACT

An ion implanter includes a high energy multi-stage linear acceleration unit including a plurality of linear acceleration units, wherein each of the linear acceleration units includes high frequency accelerators respectively in a plurality of stages; and a control device controlling an operation of the high energy multi-stage linear acceleration unit in accordance with a data set defining a voltage amplitude, a frequency, and a phase of the high frequency accelerator in each of the plurality of stages.

21 Claims, 9 Drawing Sheets

(56) References Cited

U.S. PATENT DOCUMENTS

| | | | | |
|---|---|---|---|---|
| 2016/0079032 A1* | 3/2016 | Watanabe | ........... | H01J 37/3171 |
| | | | | 250/492.3 |
| 2018/0145000 A1* | 5/2018 | Kariya | ................ | H01J 37/1474 |

FOREIGN PATENT DOCUMENTS

| | | | | | |
|---|---|---|---|---|---|
| JP | 6662549 | B2 | 3/2020 | | |
| KR | 20190059228 | A | * | 5/2019 | .......... H01J 37/3171 |

* cited by examiner

ION IMPLANTER AND ION IMPLANTATION METHOD

CROSS-REFERENCE TO RELATED APPLICATIONS

This application is a continuation of U.S. patent application Ser. No. 17/584,287 filed on Jan. 25, 2022. Further, the contents of Japanese Patent Application No. 2021-011479, filed on Jan. 27, 2021, on the basis of which priority benefits are claimed in an accompanying application data sheet, is in its entirety incorporated herein by reference.

BACKGROUND

Technical Field

Certain embodiments of the present invention relate to an ion implantation method and an ion implanter.

Description of Related Art

In a semiconductor manufacturing process, a process of implanting ions into a semiconductor wafer (also referred to as an ion implantation process) is generally performed in order to change conductivity of a semiconductor, or in order to change a crystal structure of the semiconductor. A device used for the ion implantation process is called an ion implanter. Implantation energy of the ions is determined depending on a desired implantation depth of the ions implanted near a surface of the wafer. A high energy (for example, 1 MeV or higher) ion beam is used for implantation into a relatively deep region.

In the ion implanter capable of outputting the high energy ion beam, the ion beam is accelerated by using a multi-stage high frequency linear accelerator (LINAC). In the high frequency linear accelerator, high frequency parameters such as a voltage amplitude, a frequency, and a phase in each stage are adjusted to obtain desired beam energy.

SUMMARY

According to an embodiment of the present invention, there is provided an ion implantation method using an ion implanter including a high energy multi-stage linear acceleration unit. The high energy multi-stage linear acceleration unit includes high frequency accelerators respectively in a plurality of stages, and is configured to operate in accordance with a data set defining a voltage amplitude, a frequency, and a phase of the high frequency accelerator in each of the plurality of stages. The ion implantation method includes acquiring a first data set for setting beam energy of an ion beam output from the high energy multi-stage linear acceleration unit to be a first output value, determining a second data set for setting the beam energy of the ion beam output from the high energy multi-stage linear acceleration unit to be a second output value different from the first output value, based on the first data set, and performing ion implantation by irradiating a workpiece with the ion beam output from the high energy multi-stage linear acceleration unit operating in accordance with the second data set. An acceleration phase of the high frequency accelerator in each of the plurality of stages is the same between the first data set and the second data set, in all of the high frequency accelerators respectively in the plurality of stages. The voltage amplitude of the high frequency accelerator in at least one of the plurality of the stages is different between the first data set and the second data set.

According to another embodiment of the present invention, there is provided an ion implanter. The ion implanter includes a high energy multi-stage linear acceleration unit including high frequency accelerators respectively in a plurality of stages, and a control device controlling an operation of the high energy multi-stage linear acceleration unit in accordance with a data set defining a voltage amplitude, a frequency, and a phase of the high frequency accelerator in each of the plurality of stages. The control device is configured to acquire a first data set for setting beam energy of an ion beam output from the high energy multi-stage linear acceleration unit to be a first output value, determine a second data set for setting the beam energy of the ion beam output from the high energy multi-stage linear acceleration unit to be a second output value different from the first output value, based on the first data set, and operate the high energy multi-stage linear acceleration unit in accordance with the determined second data set. The control device determines the second data set so that an acceleration phase of the high frequency accelerator in each of the plurality of stages is the same between the first data set and the second data set, in all of the high frequency accelerators respectively in the plurality of stages, and so that the voltage amplitude of the high frequency accelerator in at least one of the plurality of stages is different between the first data set and the second data set.

DETAILED DESCRIPTION

Figure 1:
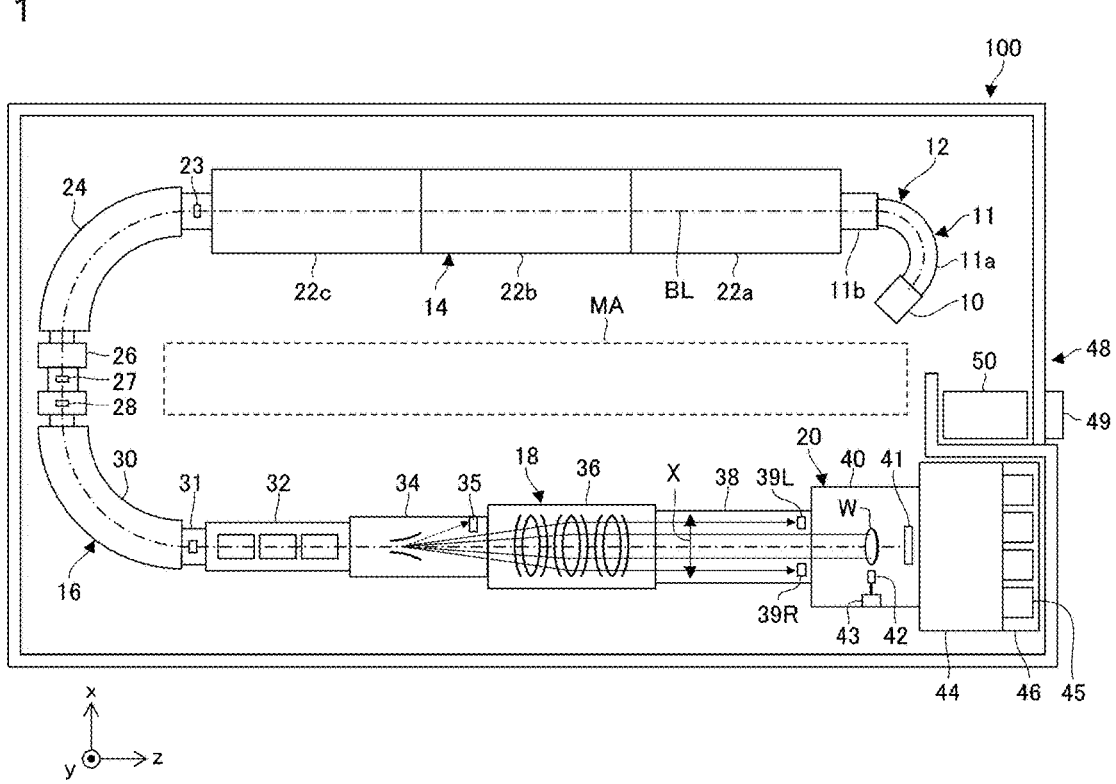
FIG. 1 is a top view illustrating a schematic configuration of an ion implanter according to an embodiment.

Recently, an ultra-high energy (for example, 4 MeV or higher) ion beam is required for implantation into a deeper region. In order to enable the ultra-high energy ion beam to be output, it is necessary to increase the number of stages of the high frequency linear accelerator, compared to that of the related art. When the number of stages of the high frequency linear accelerator increases, a time required for adjusting the high frequency parameters is lengthened accordingly, thereby leading to degraded productivity of the ion implanter.

It is desirable to provide a technique for more quickly adjusting beam energy.

Any desired combination of the above-described components, and those in which the components or expressions according to the present invention are substituted from each other in methods, devices, or systems are effectively applicable as an aspect of the present invention.

According to the present invention, ion implantation process using ion beams having various beam energy can easily be realized by more quickly adjusting the beam energy.

Hereinafter, embodiments according to the present invention will be described in detail with reference to the drawings. In describing the drawings, the same reference numerals will be assigned to the same elements, and repeated description will be appropriately omitted. Configurations described below are merely examples, and do not limit the scope of the present invention in any way.

Before the embodiments are described in detail, an outline will be described. The present embodiment relates to an ion implanter for high energy ion beam. The ion implanter causes a high frequency linear accelerator to accelerate an ion beam generated by an ion source, transports a high energy ion beam obtained by the acceleration to a workpiece (for example, a substrate or a wafer) along a beamline, and implants ions into the workpiece. In the following description, in order to facilitate understanding, an example will be described on the premise that the "workpiece (for example, the substrate or the wafer)" is the "wafer". However, the ion implantation method and the ion implanter according to the present disclosure is not limited to the example. For example, a specific example of the "workpiece (for example, the substrate or the wafer)" includes not only a semiconductor wafer but also a flat panel display substrate (for example, a glass substrate).

The term "high energy" in the present embodiment means beam energy of 1 MeV or higher, 4 MeV or higher, or 10 MeV or higher. According to high energy ion implantation, desired dopant ions are implanted into a wafer surface with relatively high energy. Therefore, the desired dopant ions can be implanted into a deeper region (for example, a depth of 5 μm or larger) of the wafer surface. For example, an application field of the high energy ion implantation is to form a P-type region and/or an N-type region in manufacturing a semiconductor device such as a state-of-the-art image sensor.

In order to realize a desired beam condition in the ion implanter, it is necessary to properly set operation parameters of various devices constituting the ion implanter. In order to obtain the ion beam having desired beam energy, it is necessary to properly set operation parameters of high frequency accelerators respectively in a plurality of stages. In addition, there are lens devices for properly transporting the ion beam on an upstream side and a downstream side of the high frequency accelerator in each stage. In order to obtain the ion beam having a desired beam current, it is necessary to properly set operation parameters of the lens devices respectively in a plurality of stages. Furthermore, in order to adjust beam quality of characteristics such as parallelism and angle distribution of the ion beam with which the wafer is irradiated, it is necessary to properly set operation parameters of various devices on the downstream side of the linear accelerator. A set of the operation parameters is generated as a "data set" for achieving the desired beam condition.

In order to generate a higher energy ion beam, it is necessary to provide the linear accelerator having a larger number of stages of the high frequency accelerators. When the number of stages of the high frequency accelerators increases, the number of the operation parameters to be adjusted also increases. Accordingly, a time required for generating a proper data set is lengthened. Depending on a semiconductor manufacturing process, it may be necessary to perform multiple implantation by irradiating the same wafer with a plurality of the ion beams having mutually different beam energy. In this case, a plurality of data sets corresponding to the plurality of beam energy have to be generated. When the plurality of data sets are generated from scratch, it takes a very long time to generate all of the plurality of data sets. This case may lead to degraded productivity of the ion implanter.

In the present embodiment, based on an existing first data set, a second data set for obtaining the ion beam having the beam energy different from that of the first data set can quickly be generated. Specifically, time in adjusting the beam energy is saved by changing a voltage amplitude in at least one stage of the high frequency accelerators respectively in the plurality of stages while fixing acceleration phases of the high frequency accelerators respectively in the plurality of stages. In addition, time in generating the second data set for realizing beam transport equivalent to that for the first data set is saved by changing the operation parameters of the lens devices respectively in the plurality of stages included in the linear accelerator according to predetermined rules. Furthermore, time in generating the second data set for realizing beam quality equivalent to that for the first data set is saved by changing the operation parameters of various devices on the downstream side of the linear accelerator according to predetermined rules.

FIG. 1 is a top view schematically illustrating an ion implanter 100 according to the embodiment. The ion implanter 100 includes a beam generation unit 12, a beam acceleration unit 14, a beam deflection unit 16, a beam transport unit 18, and a substrate transferring/processing unit 20.

The beam generation unit 12 has an ion source 10 and a mass analyzer 11. In the beam generation unit 12, the ion beam is extracted from the ion source 10, and the extracted ion beam is subjected to mass analyzing by the mass analyzer 11. The mass analyzer 11 has a mass analyzing magnet 11a and a mass resolving slit 11b. The mass resolving slit 11b is disposed on the downstream side of the mass analyzing magnet 11a. As a result of mass analyzing performed by the mass analyzer 11, only an ion species required for implantation is selected, and the ion beam of the selected ion species is guided to the subsequent beam acceleration unit 14.

The beam acceleration unit 14 has a plurality of linear acceleration units 22a, 22b, and 22c for accelerating the ion beam and a beam measurement unit 23, and forms a linearly extending portion of a beamline BL. Each of the plurality of linear acceleration units 22a to 22c includes one or more high frequency accelerators respectively in one or more stages, and causes a radio frequency (RF) electric field to act on the ion beam to accelerate the ion beam. The beam measurement unit 23 is provided most downstream of the beam acceleration unit 14, and measures at least one beam characteristic of a high energy ion beam accelerated by the plurality of linear acceleration units 22a to 22c. The beam measurement unit 23 measures beam energy, a beam current, a beam profile or the like, as the beam characteristic of the ion beam. In the present specification, the beam acceleration unit 14 is also referred to as a "high energy multi-stage linear acceleration unit".

In the present embodiment, three linear acceleration units 22a to 22c are provided. The first linear acceleration unit 22a is provided in an upstream stage of the beam acceleration unit 14, and includes the high frequency accelerators respectively in the plurality of stages (for example, 5 to 15 stages). The first linear acceleration unit 22a performs "bunching" to synchronize a continuous beam (DC beam) output from the beam generation unit 12 with a specific acceleration phase, and accelerates the ion beam to have the energy of approximately 1 MeV, for example. The second linear acceleration unit 22b is provided in a middle stage of the beam acceleration unit 14, and includes the high frequency accelerators respectively in the plurality of stages (for example, 5 to 15 stages). The second linear acceleration unit 22b accelerates the ion beam output from the first linear acceleration unit 22a to have the energy of approximately 2 to 3 MeV, for example. The third linear acceleration unit 22c is provided in a lower stage of the beam acceleration unit 14, and includes the high frequency accelerators respectively in the plurality of stages (for example, 5 to 15 stages). The third linear acceleration unit 22c accelerates the ion beam output from the second linear acceleration unit 22b to have the high energy of 4 MeV or higher, for example.

The high energy ion beam output from the beam acceleration unit 14 has an energy distribution in a certain range. Therefore, in order that the high energy ion beam is scanned and parallelized downstream of the beam acceleration unit 14 to irradiate the wafer, highly accurate energy analysis, energy distribution control, trajectory correction, and beam convergence/divergence adjustment need to be performed in advance.

The beam deflection unit 16 performs energy analysis, energy distribution control, and trajectory correction of the high energy ion beam output from the beam acceleration unit 14. The beam deflection unit 16 forms a portion extending in an arc shape in the beamline BL. A direction of the high energy ion beam is changed toward the beam transport unit 18 by the beam deflection unit 16.

The beam deflection unit 16 includes an energy analysis electromagnet 24, a horizontally focusing quadrupole lens 26 that suppresses energy distribution, an energy resolving slit 27, a first Faraday cup 28, a bending electromagnet 30 that provides beam steering (trajectory correction), and a second Faraday cup 31. The energy analysis electromagnet 24 is referred to as an energy filter electromagnet (EFM). In addition, a device group including the energy analysis electromagnet 24, the horizontally focusing quadrupole lens 26, the energy resolving slit 27, and the first Faraday cup 28 is collectively referred to as an "energy analysis device".

The energy resolving slit 27 may be configured so that a slit width is variable to adjust resolution of the energy analysis. For example, the energy resolving slit 27 may be configured to include two blocking bodies that are movable in a slit width direction, and may be configured so that the slit width is adjustable by changing an interval between the two blocking bodies. The energy resolving slit 27 may be configured so that the slit width is variable by selecting any one of a plurality of slits having different slit widths.

The first Faraday cup 28 is disposed immediately after the energy resolving slit 27, and is used in measuring the beam current for the energy analysis. The second Faraday cup 31 is disposed immediately after the bending electromagnet 30, and is provided to measure the beam current of the ion beam which enters the beam transport unit 18 after beam trajectory correction. Each of the first Faraday cup 28 and the second Faraday cup 31 is configured to be movable into and out of the beamline BL by an operation of a Faraday cup drive unit (not illustrated).

The beam transport unit 18 forms the other linearly extending portion of the beamline BL, and is parallel to the beam acceleration unit 14 while a maintenance area MA in the center of the ion implanter 100 is interposed therebetween. A length of the beam transport unit 18 is designed to be approximately the same as a length of the beam acceleration unit 14. As a result, the beamline BL including the beam acceleration unit 14, the beam deflection unit 16, and the beam transport unit 18 forms a U-shaped layout as a whole.

The beam transport unit 18 includes a beam shaper 32, a beam scanner 34, a beam dump 35, a beam parallelizer 36, a final energy filter 38, and left and right Faraday cups 39L and 39R.

The beam shaper 32 includes a focusing/defocusing lens such as a quadrupole lens device (Q lens), and is configured to shape the ion beam having passed through the beam deflection unit 16 into a desired cross-sectional shape. For example, the beam shaper 32 is configured to include an electric field type three-stage quadrupole lens (also referred to as a triplet Q lens), and has three electrostatic quadrupole lens devices. The beam shaper 32 can independently adjust convergence or divergence of the ion beam in each of a horizontal direction (x-direction) and a vertical direction (y-direction) by using the three lens devices. The beam shaper 32 may include a magnetic field type lens device, or may include a lens device that shapes the beam by using both an electric field and a magnetic field.

The beam scanner 34 is a beam deflection device configured to provide reciprocating scanning with the beam and to perform scanning in the x-direction with the shaped ion beam. The beam scanner 34 has a scanning electrode pair facing in a beam scanning direction (x-direction). The scanning electrode pair is connected to a variable voltage power supply (not illustrated), and a voltage applied between the scanning electrode pair is periodically changed. In this manner, an electric field generated between the electrodes is changed so that the ion beam is deflected at various angles. As a result, the scanning with the ion beam is performed over a scanning range indicated by an arrow X. In FIG. 1, a plurality of trajectories of the ion beam in the scanning range are indicated by a fine solid line. The beam scanner 34 may be replaced with another beam scan unit, and the beam scan unit may be configured to serve as an electromagnet device using the magnetic field.

The beam scanner 34 deflects the beam beyond the scanning range indicated by the arrow X. In this manner, the ion beam is incident into the beam dump 35 provided at a position away from the beamline BL. The beam scanner 34 temporarily evacuates the ion beam from the beamline BL toward the beam dump 35, thereby blocking the ion beam so that the ion beam does not reach the substrate transferring/processing unit 20 located downstream.

The beam parallelizer 36 is configured so that a traveling direction of the ion beam used for the scanning is parallel to the trajectory of the designed beamline BL. The beam parallelizer 36 has a plurality of arc-shaped parallelizing lens electrodes in a central portion of each of which a passing slit for the ion beam is provided. The parallelizing lens electrodes are connected to high-voltage power supplies (not illustrated), and applies the electric field generated by voltage application to the ion beam so that the traveling directions of the ion beam are parallelized. The beam parallelizer 36 may be replaced with another beam parallelizing device, and the beam parallelizing device may be configured to serve as an electromagnet device using the magnetic field.

The final energy filter 38 is configured to analyze the energy of the ion beam and deflect the ions having the required energy downward (in the −y-direction) so that the ions are guided to the substrate transferring/processing unit 20. The final energy filter 38 is referred to as an angular energy filter (AEF), and has an AEF electrode pair for electric field deflection. The AEF electrode pair is connected to a high-voltage power supply (not illustrated). The ion beam is deflected downward by applying a positive voltage to an upper AEF electrode and applying a negative voltage to a lower AEF electrode. The final energy filter 38 may be configured to include an electromagnet device for magnetic field deflection, or may be configured to include a combination between the AEF electrode pair for electric field deflection and the electromagnet device for magnetic field deflection.

The left and right Faraday cups 39L and 39R are provided on the downstream side of the final energy filter 38, and are disposed at positions into which the left and right end beams in the scanning range indicated by the arrow X can be incident. The left and right Faraday cups 39L and 39R are provided at positions that do not block the beam toward a wafer W, and measure the beam current into wafer W during ion implantation.

The substrate transferring/processing unit 20 is provided on the downstream side of the beam transport unit 18, that is, on the most downstream side of the beamline BL. The substrate transferring/processing unit 20 includes an implantation processing chamber 40, a beam monitor 41, a beam profiler 42, a profiler driving device 43, a substrate transfer device 44, and a load port 46. The implantation processing chamber 40 is provided with a platen driving device (not illustrated) that holds the wafer W during the ion implantation and moves the wafer W in a direction (y-direction) perpendicular to the beam scanning direction (x-direction).

The beam monitor 41 is provided on the most downstream side of the beamline BL inside the implantation processing chamber 40. The beam monitor 41 is provided at a position into which the ion beam can be incident when the wafer W is not present on the beamline BL, and is configured to measure beam characteristics before or between the ion implantation processes. The beam monitor 41 measures the beam current, beam parallelism or the like as the beam characteristics. For example, the beam monitor 41 is located close to a transfer port (not illustrated) connecting the implantation processing chamber 40 and the substrate transfer device 44, and is provided at a position vertically below the transfer port.

The beam profiler 42 is configured to measure the beam current at a position on the surface of the wafer W. The beam profiler 42 is configured to be movable in the x-direction by an operation of the profiler driving device 43, is retreated from an implantation position where the wafer W is located during the ion implantation, and is inserted into the implantation position when the wafer W is not located at the implantation position. The beam profiler 42 measures the beam current while moving in the x-direction. In this manner, the beam profiler 42 can measure the beam current over the entire beam scanning range in the x-direction. In the beam profiler 42, a plurality of Faraday cups may be aligned in an array in the x-direction so that the beam currents can be simultaneously measured at a plurality of positions in the beam scanning direction (x-direction).

The beam profiler 42 may include a single Faraday cup for measuring the beam current, or may include an angle measurement device for measuring angle information of the beam. For example, the angle measurement device includes a slit and a plurality of current detectors provided away from the slit in the beam traveling direction (z-direction). For example, the angle measurement device can measure angle components of the beam in the slit width direction by causing the plurality of current detectors aligned in the slit width direction to measure the beam having passed through the slit. The beam profiler 42 may include a first angle measurement device capable of measuring angle information in the x-direction and a second angle measurement device capable of measuring angle information in the y-direction.

The substrate transfer device 44 is configured to transfer the wafer W between the load port 46 on which a wafer container 45 is mounted and the implantation processing chamber 40. The load port 46 is configured so that a plurality of the wafer containers 45 can be mounted at the same time, and for example, has four mounting tables aligned in the x-direction. A wafer container transfer port (not illustrated) is provided vertically above the load port 46, and is configured so that the wafer container 45 can pass through the wafer container transfer port in the vertical direction. For example, the wafer container 45 is automatically loaded onto the load port 46 through the wafer container transfer port by a transfer robot installed on a ceiling in a semiconductor manufacturing factory where the ion implanter 100 is installed, and is automatically unloaded from the load port 46.

The ion implanter 100 further includes a central control device 50. The central control device 50 controls an overall operation of the ion implanter 100. The central control device 50 is realized by an element or a machine device such as a computer CPU and a memory in terms of hardware, and is realized by a computer program or the like in terms of software. Various functions provided by the central control device 50 can be realized in cooperation between the hardware and the software.

An operation panel 49 having a display unit and an input device for setting the operation parameters of the ion implanter 100 is provided in the vicinity of the central control device 50. The positions of the operation panel 49 and the central control device 50 are not particularly limited. However, for example, the operation panel 49 and the central control device 50 can be disposed adjacent to an entrance/exit 48 of the maintenance area MA between the beam generation unit 12 and the substrate transferring/processing unit 20. Work efficiency can be improved by adjoining locations of the ion source 10, the load port 46, the operation panel 49, and the central control device 50 which are frequently operated by an operator who manages the ion implanter 100.

Figures 2A, 2B, 2C:
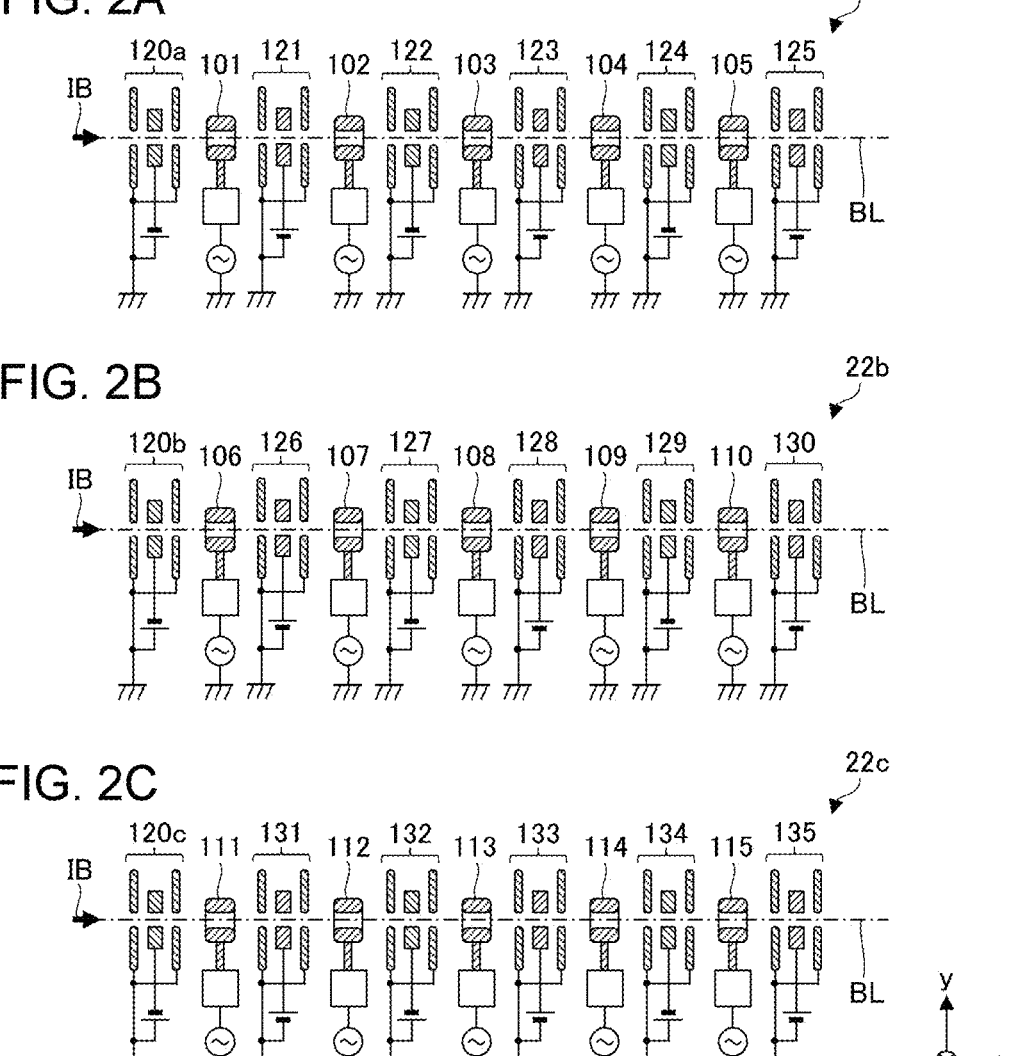
FIGS. 2A to 2C are sectional views illustrating a configuration of a linear acceleration unit.

Subsequently, a configuration of the beam acceleration unit 14 will be described in detail. FIGS. 2A to 2C are sectional views illustrating each configuration of the linear acceleration units 22a to 22c. FIG. 2A illustrates a configuration of the first linear acceleration unit 22a, FIG. 2B illustrates a configuration of the second linear acceleration unit 22b, and FIG. 2C illustrates a configuration of the third linear acceleration unit 22c. The linear acceleration units 22a to 22c include high frequency accelerators 101 to 115 respectively in a plurality of stages and electrostatic quadrupole lens devices 120a, 120b, 120c, and 121 to 135 respectively in a plurality of stages, and the high frequency accelerators and the electrostatic quadrupole lens devices in respective stages are alternately disposed along the beamline BL.

The high frequency accelerator accelerates or decelerates the ion particles forming the ion beam IB by applying a high frequency voltage $V_{RF}$ to a high frequency electrode through which the ion beam IB passes. The high frequency accelerator in each stage is configured so that a voltage amplitude $V_0$ of the high frequency voltage $V_{RF}$, a frequency f, and a phase φ can be individually adjusted. In the present specification, the voltage amplitude $V_0$, the frequency f, and the phase φ of the high frequency voltage $V_{RF}$ are collectively referred to as a "high frequency parameter".

The electrostatic quadrupole lens device includes lens electrodes for causing an electrostatic field to act on the ion beam ion IB to focus or defocus the ion beam IB, and ground electrodes provided on the upstream side and the downstream side of the lens electrodes. The electrostatic quadrupole lens device functions as a horizontally focusing (vertically defocusing) lens that causes the beam to converge in the x-direction or a vertically focusing (horizontally defocusing) lens that causes the beam to converge in the y-direction by switching positive and negative voltage applied to the lens electrodes.

In FIGS. 2A to 2C, the lens electrodes facing in the y-direction are illustrated, and the lens electrodes facing in the x-direction are omitted. When the negative voltage is applied to the lens electrode facing in the y-direction, the electrostatic quadrupole lens device functions as the horizontally focusing (vertically defocusing) lens. On the other hand, when the positive voltage is applied to the lens electrodes facing in the y-direction, the electrostatic quadrupole lens functions as the vertically focusing (horizontally defocusing) lens. Configurations of the lens electrodes will be described later with reference to FIGS. 3A and 3B.

The first linear acceleration unit 22a includes high frequency accelerators 101, 102, 103, 104, and 105 in five stages and electrostatic quadrupole lens devices 120a, 121, 122, 123, 124, and 125 in six stages. Each of the electrostatic quadrupole lens devices 121 to 125 from the first stage to the fifth stage except for the electrostatic quadrupole lens device 120a provided in the inlet of the first linear acceleration unit 22a is disposed on the downstream side of each corresponding stage of the high frequency accelerators 101 to 105 from the first stage to the fifth stage.

The electrostatic quadrupole lens devices 120a, and 121 to 125 in six stages provided in the first linear acceleration unit 22a are disposed so that the horizontally focusing lens and the vertically focusing lens are alternately disposed along the beamline BL. For example, the electrostatic quadrupole lens devices 120a, 122, and 124 in the inlet, the second stage, and the fourth stage of the first linear acceleration unit 22a are the horizontally focusing lenses, and the electrostatic quadrupole lens devices 121, 123, and 125 in the first stage, the third stage, and the fifth stage are the vertically focusing lenses.

The second linear acceleration unit 22b includes high frequency accelerators 106, 107, 108, 109, and 110 in five stages and electrostatic quadrupole lens devices 120b, 126, 127, 128, 129, and 130 in six stages. Each of the electrostatic quadrupole lens devices 126 to 130 from the sixth stage to the tenth stage except for the electrostatic quadrupole lens device 120b provided in the inlet of the second linear acceleration unit 22b is disposed on the downstream side of each corresponding stage of the high frequency accelerators 106 to 110 from the sixth stage to the tenth stage. The electrostatic quadrupole lens devices 120b, and 126 to 130 in sixth stages provided in the second linear acceleration unit 22b are disposed so that the horizontally focusing lens and the vertically focusing lens are alternately disposed along the beamline BL. For example, the electrostatic quadrupole lens devices 120b, 127, and 129 in the inlet, the seventh stage, and the ninth stage of the second linear acceleration unit 22b are the horizontally focusing lenses, and the electrostatic quadrupole lens devices 126, 128, and 130 in the sixth stage, the eighth stage, and the tenth stage are vertically focusing lenses.

The third linear acceleration unit 22c includes high frequency accelerators 111, 112, 113, 114, and 115 in five stages and electrostatic quadrupole lens devices 120c, 131, 132, 133, 134, and 135 in sixth stages. Each of the electrostatic quadrupole lens devices 131 to 135 from the eleventh stage to the fifteenth stage except for the electrostatic quadrupole lens device 120c provided in the inlet of the third linear acceleration unit 22c is disposed on the downstream side of each corresponding stage of the high frequency accelerators 111 to 115 from the eleventh stage to the fifteenth stage. The electrostatic quadrupole lens devices 120c, and 131 to 135 in six stages provided in the third linear acceleration unit 22c are disposed so that the horizontally focusing lens and the vertically focusing lens are alternately disposed along the beamline BL. For example, the electrostatic quadrupole lens devices 120c, 132, and 134 in the inlet, the twelfth stage, and the fourteenth stage of the third linear acceleration unit 22c are the horizontally focusing lenses, and the electrostatic quadrupole lens devices 131, 133, and 135 in the eleventh stage, the thirteenth stage, and the fifteenth stage are the vertically focusing lenses.

The number of stages of the high frequency accelerators and the electrostatic quadrupole lens devices which are included in the linear acceleration units 22a to 22c is not limited to the illustrated example, and may be different from that in the illustrated example. In addition, disposition of the electrostatic quadrupole lens devices may be different from that in the illustrated example. For example, the electrostatic quadrupole lens device in at least one stage may have one pair of the horizontally focusing lens and the vertically focusing lens, or may have a plurality of pairs of the horizontally focusing lens and the vertically focusing lens.

Figure 3B:
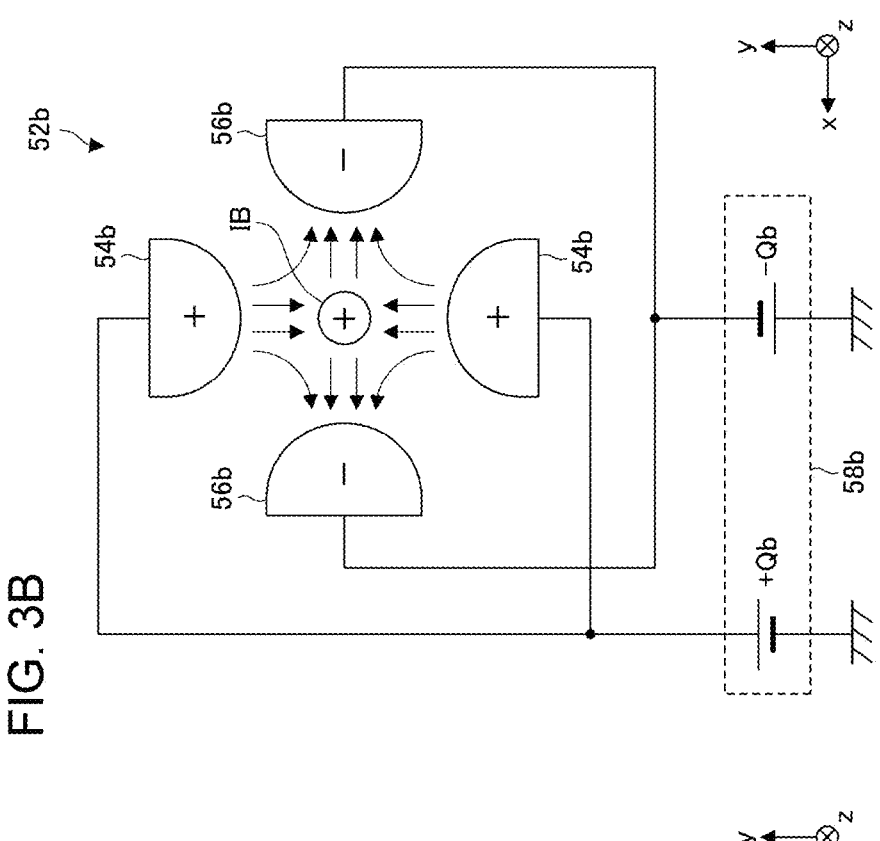
FIGS. 3A and 3B are front views illustrating schematic configurations of electrostatic quadrupole lens devices.
Figure 3A:
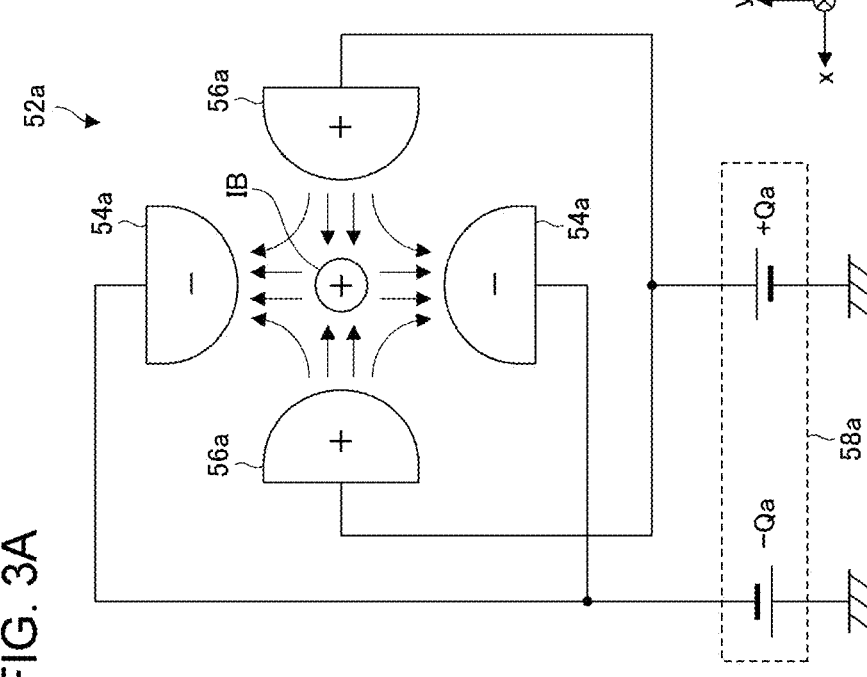

FIGS. 3A and 3B are front views illustrating schematic configurations of the electrostatic quadrupole lens devices 52a and 52b when viewed from the upstream side of the beamline. The electrostatic quadrupole lens device 52a in FIG. 3A is the horizontally focusing lens that causes the ion beam IB to converge in a horizontal direction (x-direction), and the electrostatic quadrupole lens device 52b in FIG. 3B is the vertically focusing lens that causes the ion beam IB to converge in a vertical direction (y-direction).

The electrostatic quadrupole lens device 52a in FIG. 3A has a pair of upper and lower lens electrodes 54a facing in the vertical direction (y-direction) and a pair of left and right lens electrodes 56a facing in the horizontal direction (x-direction). A negative potential −Qa is applied to the upper and lower lens electrodes 54a, and a positive potential +Qa is applied to the left and right lens electrodes 56a. With respect to the ion beam IB formed of positively charged ion particles, the electrostatic quadrupole lens device 52a generates an attractive force between the upper and lower lens electrodes 54a having the negative potential, and generates a repulsive force between the left and right lens electrodes 56a having the positive potential. In this manner, the electrostatic quadrupole lens device 52*a* causes the ion beam IB to converge in the x-direction and to diverge in the y-direction and adjusts a beam shape.

As in FIG. 3A, the electrostatic quadrupole lens device 52*b* in FIG. 3B has a pair of upper and lower lens electrodes 54*b* facing in the vertical direction (y-direction) and a pair of left and right lens electrodes 56*b* facing in the horizontal direction (x-direction). In FIG. 3B, applied positive and negative potentials are opposite to those in FIG. 3A, a positive potential +Qb is applied to the upper and lower lens electrodes 54*b*, and a negative potential −Qb is applied to the left and right lens electrodes 56*b*. As a result, the electrostatic quadrupole lens device 52*b* causes the ion beam IB to converge in the y-direction and to diverge in the x-direction and adjusts the beam shape.

Figure 4:
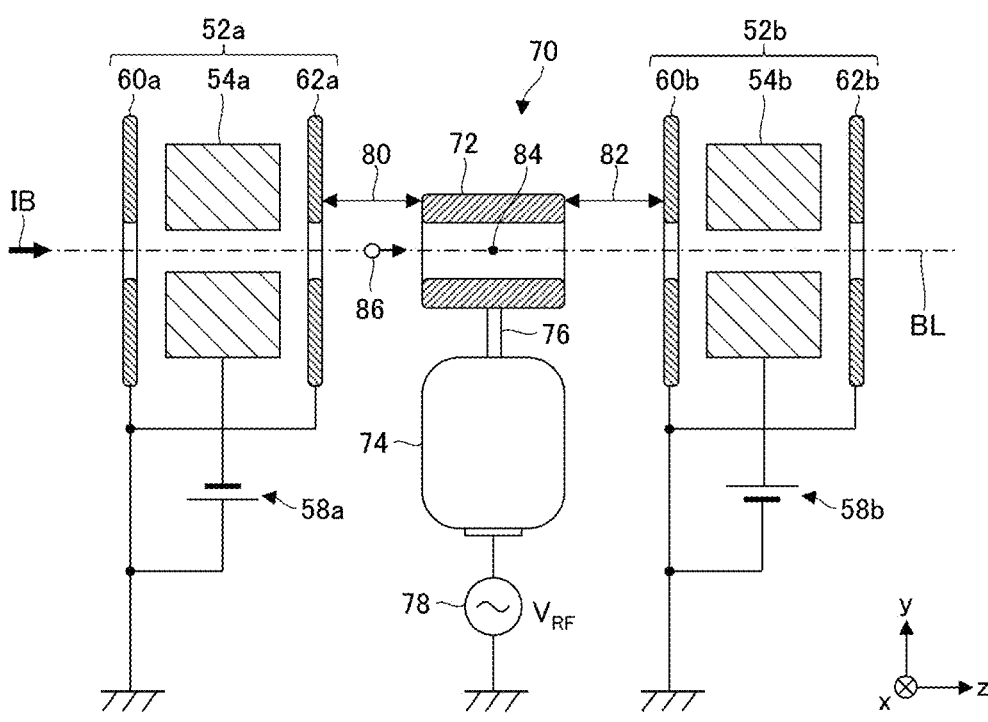
FIG. 4 is a sectional view illustrating a schematic configuration of a high frequency accelerator.

FIG. 4 is a sectional view illustrating a schematic configuration of the high frequency accelerator 70, and illustrates a configuration of the high frequency accelerator corresponding to one stage included in each of the linear acceleration units 22*a* to 22*c*. The high frequency accelerator 70 includes a high frequency electrode 72, a high frequency resonator 74, a stem 76, and a high frequency power supply 78. The high frequency electrode 72 has a hollow cylindrical electrode body, and the ion beam IB passes through the inside of the electrode body. The high frequency electrode 72 is connected to the high frequency resonator 74 via the stem 76. The high frequency power supply 78 supplies the high frequency voltage $V_{RF}$ to the high frequency resonator 74. The central control device 50 controls the high frequency resonator 74 and the high frequency power supply 78 to adjust the voltage amplitude $V_0$, the frequency f, and the phase $\varphi$ of the high frequency voltage $V_{RF}$ applied to the high frequency electrode 72.

The electrostatic quadrupole lens devices 52*a* and 52*b* are provided on the upstream side and the downstream side of the high frequency accelerator 70. The electrostatic quadrupole lens device 52*a* on the upstream side has a first ground electrode 60*a*, a second ground electrode 62*a*, upper and lower lens electrodes 54*a*, left and right lens electrodes 56*a*, and a lens power supply 58*a* (refer to FIG. 3). The upper and lower lens electrodes 54*a* and the left and right lens electrodes 56*a* are provided between the first ground electrode 60*a* and the second ground electrode 62*a*. The electrostatic quadrupole lens device 52*b* on the downstream side has a first ground electrode 60*b*, a second ground electrode 62*b*, upper and lower lens electrodes 54*b*, left and right lens electrodes 56*b*, and a lens power supply 58*b* (refer to FIG. 3). The upper and lower lens electrodes 54*b* and the left and right lens electrodes 56*b* are provided between the first ground electrode 60*b* and the second ground electrode 62*b*.

In an example in FIG. 4, the electrostatic quadrupole lens device 52*a* on the upstream side is the horizontally focusing (vertically defocusing) lens, and the electrostatic quadrupole lens device 52*b* on the downstream side is the vertically focusing (horizontally defocusing) lens. The electrostatic quadrupole lens device 52*a* on the upstream side may be the vertically focusing (horizontally defocusing) lens, and the electrostatic quadrupole lens device 52*b* on the downstream side may be the horizontally focusing (vertically defocusing) lens, depending on which stage the high frequency accelerator 70 is located in any stage. The horizontally focusing and the vertically focusing can be changed by inverting the positive and negative voltages applied by the lens power supplies 58*a* and 58*b*.

The high frequency accelerator 70 in FIG. 4 accelerates or decelerates the ion particle 86 forming the ion beam IB by using potential differences in an upstream side gap 80 between the second ground electrode 62*a* and the high frequency electrode 72 on the upstream side, and in a downstream side gap 82 between the high frequency electrode 72 and the first ground electrode 60*b* on the downstream side. For example, the ion particle 86 passing through the high frequency accelerator 70 can be accelerated by adjusting the phase q of the high frequency voltage $V_{RF}$ so that the negative voltage is applied to the high frequency electrode 72 when the ion particle 86 passes through the upstream side gap 80, and the positive voltage is applied to the high frequency electrode 72 when the ion particle 86 passes through the downstream side gap 82. The inside of the high frequency electrode 72 is substantially equipotential. Accordingly, the ion particle 86 is not accelerated or decelerated when passing through the inside of the high frequency electrode 72.

Figure 5:
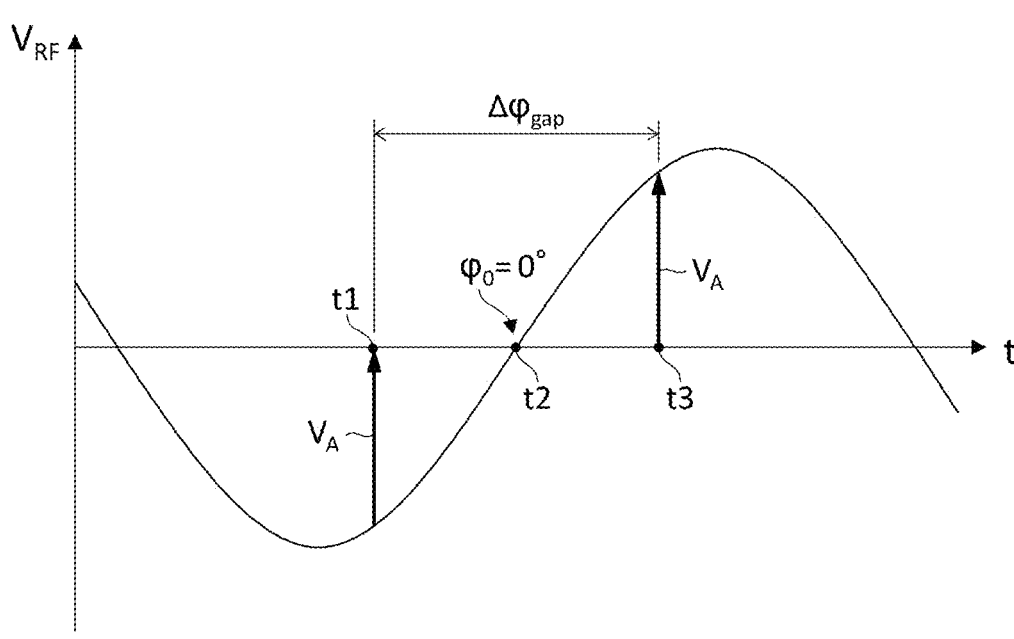
FIG. 5 is a graph schematically illustrating an example of a time waveform of a high frequency voltage and acceleration or deceleration energy received by an ion particle.

FIG. 5 is a graph schematically illustrating an example of a time waveform of the high frequency voltage $V_{RF}$ and acceleration or deceleration energy received by the ion particle 86. Time t1 is a timing at which the ion particle 86 passes through the upstream side gap 80, time t2 is a timing at which the ion particle 86 passes through a center 84 of the high frequency electrode 72, and time t3 is a timing at which the ion particle 86 passes through the downstream side gap 82. In the present specification, the phase $\varphi$ of the high frequency voltage $V_{RF}$ at the time t2 at which the ion particle 86 passes through the center 84 of the high frequency electrode 72 is referred to as an "acceleration phase $\varphi_0$. The acceleration phase $\varphi_0$ is a relative phase based on a passage timing of the ion particle 86, and is different from the phase (absolute phase) $\varphi$ of the high frequency voltage $V_{RF}$. However, a value of the acceleration phase $\varphi_0$ can be controlled by adjusting the phase q. When the acceleration phase $\varphi_0$ is changed, the amount of the acceleration or deceleration energy received by the ion particle 86 from the high frequency accelerator 70 is changed. Therefore, the acceleration phase $\varphi_0$ is one of important parameters for controlling a value of the beam energy.

FIG. 5 illustrates a case where the acceleration phase is set to $\varphi_0 = 0°$. In this case, at the time t1 at which the ion particle 86 passes through the upstream side gap 80, the high frequency voltage $V_{RF}$ has a negative value $(-V_A)$. At the time t1, a potential (0V) of the second ground electrode 62*a* on the upstream side is higher than the potential $(-V_A)$ of the high frequency electrode 72. Therefore, the ion particle 86 obtains acceleration energy caused by the potential difference $V_A$. In addition, at the time t3 at which the ion particle 86 passes through the downstream side gap 82, the high frequency voltage $V_{RF}$ has a positive value $(+V_A)$. At the time t3, the potential $(+V_A)$ of the high frequency electrode 72 is higher than the potential (0V) of the first ground electrode 60*b* on the downstream side. Therefore, the ion particle 86 obtains the acceleration energy caused by the potential difference $V_A$. As a result, the ion particle 86 obtains the acceleration energy corresponding to a total voltage of $2V_A$ in the upstream side gap 80 and the downstream side gap 82.

Figure 6:
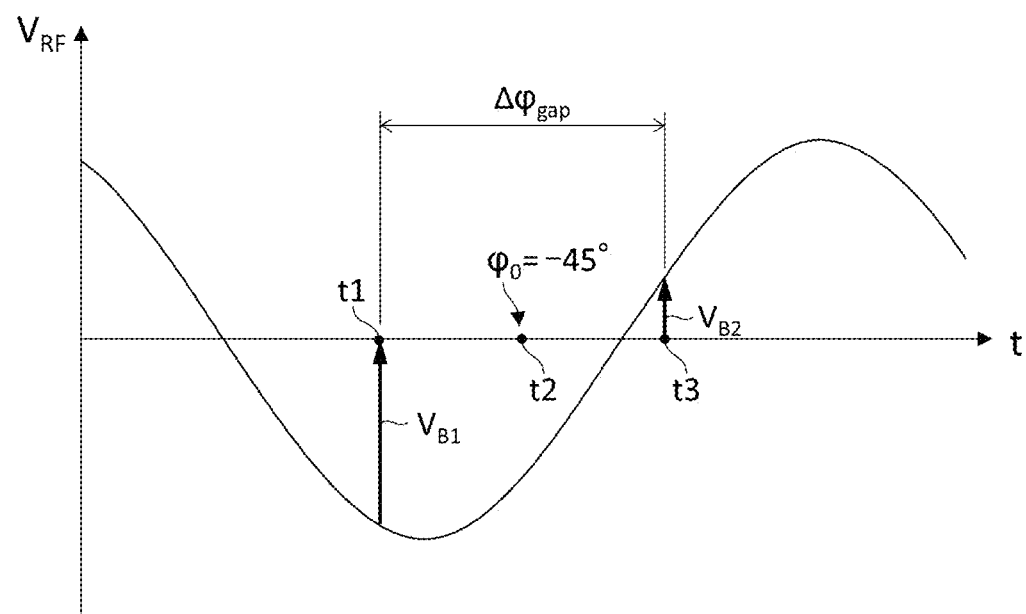
FIG. 6 is a graph schematically illustrating an example of the time waveform of the high frequency voltage and the acceleration or deceleration energy received by the ion particle.

FIG. 6 illustrates a case where the acceleration phase is set to $\varphi_0 = -45°$. The amplitude and the frequency of the high frequency voltage $V_{RF}$ and a phase difference $\Delta\varphi_{gap}$ from the upstream side gap 80 to the downstream side gap 82 are the same as those in FIG. 5. The acceleration phase $\varphi_0$ is shifted by −45°. In this manner, the acceleration energy caused by a potential difference $V_{B1}$ is obtained in the upstream side gap 80 at the time t1, and the acceleration energy caused by a potential difference $V_{B2}$ is obtained in the downstream side gap 82 at the time t3, thereby obtaining the acceleration energy corresponding to a voltage of $V_{B1}+V_{B2}$ in total. The acceleration energy corresponding to the voltage of $V_{B1}+V_{B2}$ is smaller than the acceleration energy corresponding to the voltage of $2V_A$ illustrated in the example in FIG. 5.

Figure 7:
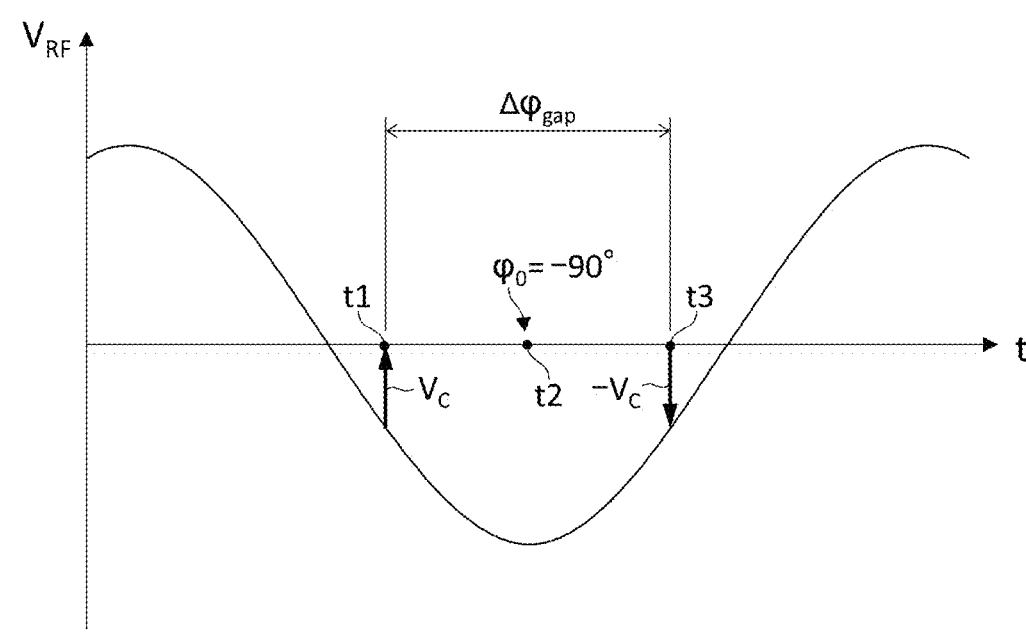
FIG. 7 is a graph schematically illustrating an example of the time waveform of the high frequency voltage and the acceleration or deceleration energy received by the ion particle.

FIG. 7 illustrates a case where the acceleration phase is set to $\varphi_0=-90°$. The amplitude and the frequency of the high frequency voltage $V_{RF}$ and a phase difference $\Delta\varphi_{gap}$ from the upstream side gap 80 to the downstream side gap 82 are the same as those in FIG. 5. The acceleration phase $\varphi$ is shifted by $-90°$. In this manner, whereas the acceleration energy caused by a potential difference $V_C$ is obtained in the upstream side gap 80 at the time t1, the deceleration energy caused by a potential difference $-V_C$ is obtained in the downstream side gap 82 at the time t3. As a result, the acceleration or deceleration energy obtained in total is zero.

Acceleration or deceleration energy $\Delta E$ applied by the high frequency accelerator 70 corresponding to one stage depends on the voltage amplitude $V_0$ of the high frequency voltage $V_{RF}$, the acceleration phase $\varphi_0$, and the phase difference $\Delta\varphi_{gap}$ for which the ion particle 86 reaches the downstream side gap 82 from the upstream side gap 80. According to a knowledge of the present inventor, the acceleration or deceleration energy $\Delta E$ can be approximated by Equation (1) below.

$$\Delta E \approx qV_0 \cdot \alpha(E)\sin\left(\Delta\varphi_{gap}/2\right)\cos(\varphi_0) \qquad (1)$$

Here, q is a charge of the ion particle 86, and $\alpha(E)$ is a coefficient depending on energy E of the ion particle 86. The phase difference $\Delta\varphi_{gap}$ is determined by an electrode length $L_0$ of the high frequency electrode 72, a gap length $L_1$ of the upstream side gap 80, a gap length $L_2$ of the downstream side gap 82, a passing speed v (average speed) of the ion particle 86, and the frequency f of the high frequency voltage $V_{RF}$. When roughly calculated, the phase difference $\Delta\varphi_{gap}$ corresponds to a passing time $\tau\approx(L_0+L_1/2+L_2/2)/v$ from the upstream side gap 80 to the downstream side gap 82. The passing speed v (average speed) of the ion particle 86 is determined by a mass m and the energy E of the ion particle 86.

Based on Equation (1) above, it can be understood that the acceleration or deceleration energy $\Delta E$ applied to the ion particle 86 by the high frequency accelerator 70 can be adjusted by changing at least one of the voltage amplitude $V_0$ and the acceleration phase $\varphi_0$ of the high frequency accelerator 70. Therefore, final beam energy of the ion beam output from the beam acceleration unit 14 can be adjusted by changing at least one of the voltage amplitude $V_0$ and the acceleration phase $\varphi_0$ of each of the high frequency accelerators 101 to 115 respectively in the plurality of stages.

Figure 8A:
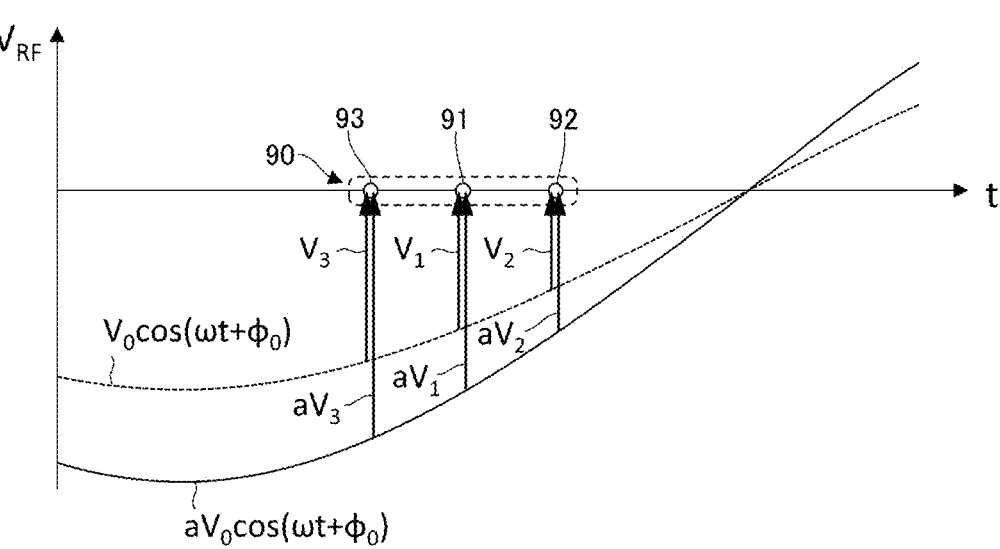
FIGS. 8A and 8B are graphs schematically illustrating examples of the acceleration or deceleration energy received by a group of bunched ion particles.
Figure 8B:
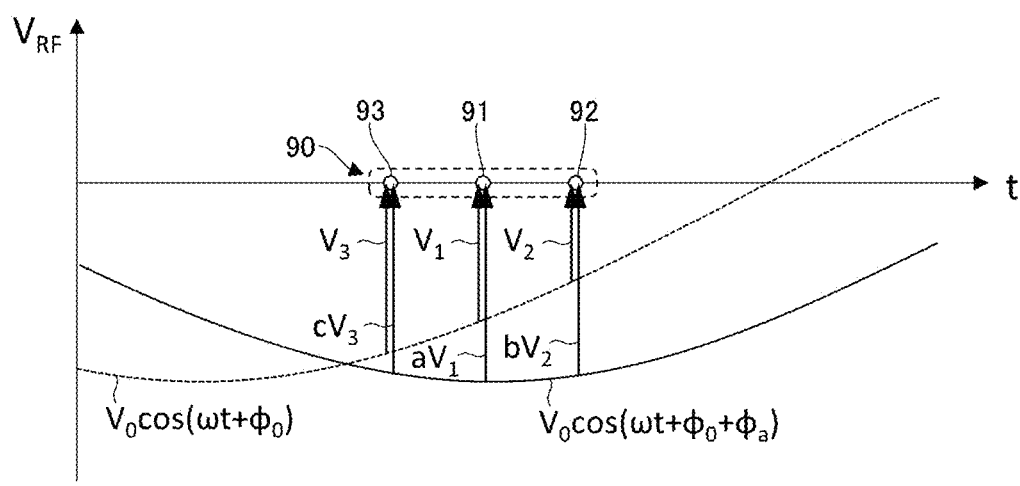

FIGS. 8A and 8B are graphs schematically illustrating examples of the acceleration or deceleration energy received by a bunched ion particle group 90. The beam acceleration unit 14 accelerates the bunched ion particle group 90 which has a specific acceleration phase. It is ideal that the ion particle group 90 does not have a spatial spread in the beam traveling direction. However, the ion particle group 90 actually has the spatial spread. As a result, for a first ion particle 91 located near the center of the ion particle group 90, a second ion particle 92 located near a leading end of the ion particle group 90, and a third ion particle 93 located near a tail end of the ion particle group 90, potential differences $V_1$, $V_2$, and $V_3$ received from the high frequency voltage $V_{RF}$ are different. When the potential differences $V_1$, $V_2$, and $V_3$ respectively received by the ion particles 91 to 93 are different, the acceleration energy respectively received by the ion particles 91 to 93 is different. As a result, the energy distribution of the ion particle group 90 can be changed before and after the ion particle group 90 passes through the high frequency accelerator 70.

FIG. 8A illustrates a case where the acceleration or deceleration energy $\Delta E$ received by the ion particle group 90 is adjusted by changing the voltage amplitude $V_0$ of the high frequency voltage $V_{RF}$ to a-times the original value. A curve indicated by a dashed line is a high frequency voltage waveform $V_0 \cos(\omega t+\varphi_0)$ before the adjustment, and a curve indicated by a solid line is a high frequency voltage waveform a $V_0 \cos(\omega t+\varphi_0)$ after the adjustment. Here, $\omega$ is an angular frequency of the high frequency voltage $V_{RF}$, and $\omega=2\pi f$. The potential differences received by the ion particles 91 to 93 becomes all a-times after the adjustment. Accordingly, the acceleration energy received by each of the ion particles 91 to 93 can be linearly changed. As a result, a change in the energy distribution of the ion particle group 90 before and after passing through the high frequency accelerator 70 is substantially the same before and after the adjustment, and a transport state of the ion particle group 90 is also substantially the same before and after the adjustment. As a result, only the beam energy can be changed while the beam quality is the same before and after the adjustment.

FIG. 8B illustrates case where the acceleration or deceleration energy $\Delta E$ received by the ion particle group 90 is adjusted by changing the acceleration phase $\varphi_0$ of the high frequency voltage $V_{RF}$ by $\varphi_a$. A curve indicated by a dashed line is a high frequency voltage waveform $V_0 \cos(\omega t+\varphi_0)$ before the adjustment, and a curve indicated by a solid line is a high frequency voltage waveform $V_0 \cos(\omega t+\varphi_0+\varphi_a)$ after the adjustment. As in FIG. 8A, a potential difference received by the first ion particle 91 becomes a-times after the adjustment. However, potential differences received by the second ion particle 92 and the third ion particle 93 do not become a-times after the adjustment, and respectively become b-times and c-times. Accordingly, the acceleration energy received by each of the ion particles 91 to 93 is changed in a non-linear manner. As a result, a change in the energy distribution of the ion particle group 90 before and after passing through the high frequency accelerator 70 is different before and after the adjustment. As a result, the beam transport state or the beam quality is less likely to be the same before and after the adjustment.

In the present embodiment, as methods of adjusting the beam energy, a first adjustment method of causing the acceleration phase $\varphi_0$ to be variable and a second adjustment method of fixing the acceleration phase $\varphi_0$ are used. The first adjustment method is used when a new data set is generated. The second adjustment method is used when the beam energy is finely adjusted, based on an existing data set. In the second adjustment method, the acceleration phase $\varphi_0$ is fixed. Accordingly, only the beam energy can be substantially adjusted while the beam transport state is maintained to be the same as that of the existing data set.

Figure 9:
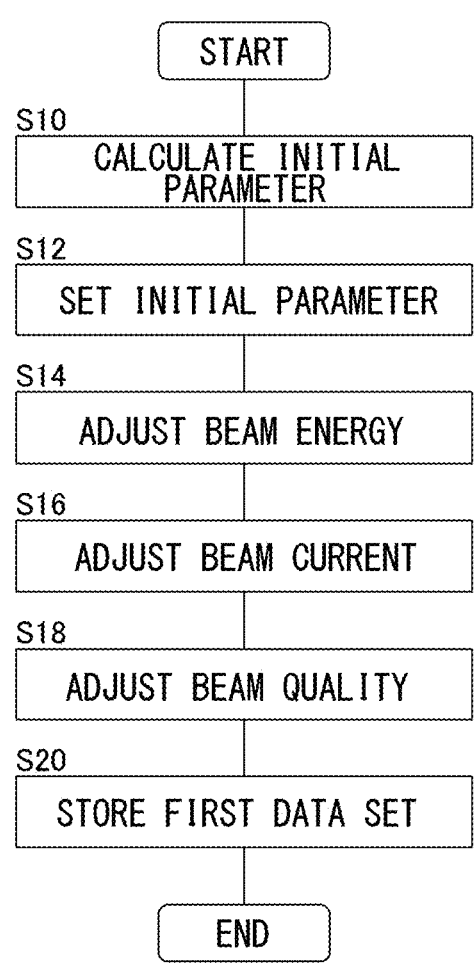
FIG. 9 is a flowchart illustrating a flow of a first adjustment method.

FIG. 9 is a flowchart illustrating a flow of the first adjustment method. First, initial values (initial parameters) of operation parameters of various devices constituting the ion implanter 100 are calculated, based on a desired beam condition (S10). As the initial parameters, high frequency parameters in each stage of the high frequency accelerators 101 to 115 respectively in the plurality of stages and lens parameters that determine applied voltages in each stage of the electrostatic quadrupole lens devices 120*a* to 120*c* and 121 to 135 respectively in the plurality of stages are calculated.

The values of the high frequency parameters and the lens parameters are calculated by setting target beam energy and performing a simulation using a predetermined algorithm. For example, suitable high frequency parameters are set for a simulation model simulating a beam optical system of the beam acceleration unit 14, and a value of the output energy is calculated while changing the values of the high frequency parameters. In this manner, the high frequency parameters for obtaining the target beam energy are calculated. In addition, the transport state of the ion beam IB is calculated while the values of the lens parameters are changed. In this manner, the lens parameters for maximizing transport efficiency of the ion beam IB are calculated. A state where the transport efficiency of the ion beam IB is maximized means a state where a ratio of the beam which is lost by colliding with the high frequency electrode 72 or the lens electrode 54*a*, 54*b*, 56*a*, or 56*b* in each stage is minimized.

Next, the calculated initial parameters are set in various devices constituting the ion implanter 100, and the ion beam IB is generated (S12). Subsequently, the beam energy of the generated ion beam IB is measured, and the high frequency parameters are adjusted, based on a measurement value of the beam energy. In this manner, the beam energy is adjusted to have the target value (S14). Even when the beam acceleration unit 14 is operated, based on the initial parameters obtained by performing the simulation, the desired beam energy cannot always be obtained. Accordingly, the adjustment in S14 is required. It is conceivable that there are some reasons for requiring the adjustment. For example, the reasons include a manufacturing error or an assembling error of the high frequency electrode 72, or an error of the amplitude, the frequency, or the phase of the high frequency voltage $V_{RF}$ applied to the high frequency electrode 72.

In the adjustment in S14, for example, the adjusted high frequency parameters are calculated by performing the simulation using the same algorithm as that in S10. For example, corrected high frequency parameters are calculated by reflecting a difference between the measurement value and the target value of the beam energy in the simulation model. Fine adjustment of the high frequency parameters is not easy. In many cases, the measurement of the beam energy and a time-consuming simulation have to be repeatedly performed.

When the desired beam energy is obtained in S14, the beam current of the generated ion beam IB is measured, and the beam current is adjusted by changing the lens parameters, based on the measurement value of the beam current (S16). For example, the lens parameter of the electrostatic quadrupole lens device at each stage is adjusted so that the transport efficiency of the ion beam IB is maximized by the beam acceleration unit 14. The beam current of the ion beam IB output from the beam acceleration unit 14 can be maximized by maximizing the transport efficiency of the ion beam IB. Fine adjustment of the lens parameters is also not easy. It is necessary to repeat the fine-modifications of the lens parameters in the plurality of stages while the beam current is measured. When the beam current is insufficient to the target value, or conversely, when the beam current is excessive, a parameter of the ion source 10 may be modified.

When the desired beam current is obtained in S16, the beam quality is measured on the downstream side of the beam acceleration unit 14, and the operation parameters of various devices are adjusted, based on the measurement value of the beam quality. In this manner, the beam quality is adjusted to have the target value (S18). For example, the beam quality adjusted in S18 includes a beam size, beam parallelism, or a beam angle. For example, the beam size can be adjusted by changing a parameter of the focusing/defocusing lens included in the beam shaper 32. For example, the beam parallelism can be adjusted by changing a parameter of the parallelizing lens included in the beam parallelizer 36. For example, the beam angle in the x-direction can be adjusted by changing a parameter of the bending electromagnet 30.

When the desired beam quality is obtained in S18, a set of the operation parameters set in various devices of the ion implanter 100 is stored as a data set (S20). In this manner, the first data set for realizing the desired beam condition is completed.

The first adjustment method for generating the first data set includes the adjustment processes in S14, S16, and S18. Accordingly, in many cases, it takes a long time to obtain an optimum data set. Each process in S10 to S20 in the first adjustment method can be performed by an automatic adjusting program executed by the central control device 50. However, when the desired t value cannot be obtained, manual adjustment has to be performed by an operator in some cases. In this case, it takes more time to obtain the optimum data set. The ion implantation process cannot be performed while the first adjustment method is performed. Accordingly, when it takes a long time for the adjustment, productivity of the ion implanter 100 is degraded.

Figure 10:
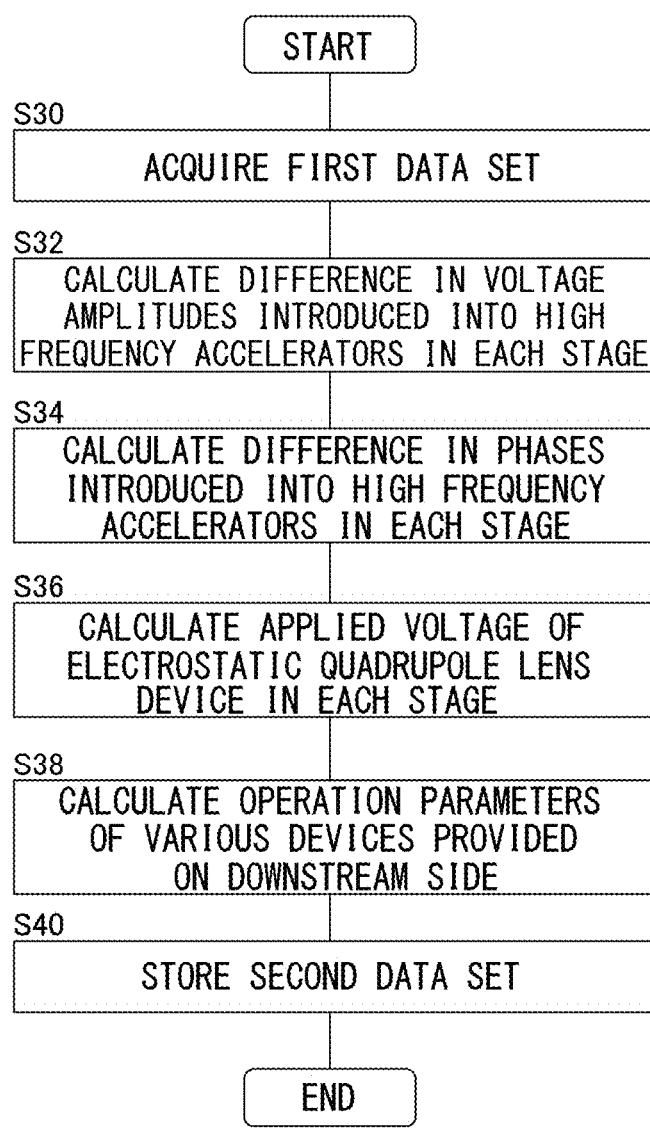
FIG. 10 is a flowchart illustrating a flow of a second adjustment method.

FIG. 10 is a flowchart illustrating a flow of the second adjustment method, and illustrates a method of generating the second data set, based on the existing first data set. First, the first data set for realizing a beam condition close to the desired beam condition is acquired from the existing data set (S30). For example, the acquired first data set is the existing data set generated by the first adjustment method in FIG. 9, and is a data set which is used in the actual implantation process. The first data set may be the existing data set generated by the second adjustment method in FIG. 10. In the second adjustment method, a new second data set is quickly determined by calculation based on the existing first data set.

Next, a difference in the voltage amplitudes $V_0$ introduced into the high frequency accelerator 101 to 115 in each stage is calculated (S32). In S32, based on the difference between the target beam energy and the beam energy of the ion beam obtained by the first data set, it is determined in which stage of the high frequency accelerator the difference in the voltage amplitudes $V_0$ is to be introduced, and a change amount or a change rate of the voltage amplitude $V_0$ to be introduced into the high frequency accelerator in the determined stage is determined. In the present embodiment, the difference in the voltage amplitudes $V_0$ is introduced into at least one of the high frequency accelerators 101 to 115 respectively in the plurality of stages. The difference in the voltage amplitudes may be introduced into two or more of the high frequency accelerators 101 to 115 respectively in the plurality of stages. The difference in the voltage amplitudes $V_0$ may be introduced into more than half (for example, 8 or more) of the high frequency accelerations 101 to 115 respectively in the plurality of stages. Alternatively, the difference in the voltage amplitudes $V_0$ may be introduced into all of the high frequency accelerators 101 to 115 respectively in the plurality of stages. In the high frequency accelerator into which the difference in the voltage amplitudes $V_0$ is not introduced, the voltage amplitude $V_0$ is the same between the first data set and the second data set.

In S32, the high frequency accelerator in an most upstream stage (for example, only the first stage or the first stage and the second stage) may be excluded from a subject into which the difference in the voltage amplitudes $V_0$ is introduced. That is, for the high frequency accelerator in the most upstream stage, the high frequency parameter stored in the first data set may be used in the second data set without any change. The high frequency accelerator in the most upstream stage is used in bunching for concentrating a continuous beam (DC beam) extracted from the ion source 10 to a specific acceleration phase. The bunching performed by the high frequency accelerator in the most upstream stage determines beam capturing efficiency in the high frequency accelerator on the downstream side, and greatly affects the beam transport state in the whole beam acceleration unit 14 and the beam quality of the ion beam IB output from the beam acceleration unit 14. Therefore, when the high frequency parameter of the high frequency accelerator in the most upstream stage is changed, the time-consuming adjustment equivalent to that in the first adjustment method is required.

In S32, the high frequency accelerator in a most downstream stage (for example, the fifteenth stage) may also be excluded from the subject into which the difference in the voltage amplitudes $V_0$ is introduced. For example, the high frequency accelerator in the most downstream stage may have remaining capacity to separately introduce the difference in the voltage amplitudes $V_0$ so that the difference can be used for final fine adjustment of the beam energy. In the beam acceleration unit 14, when the voltage amplitude $V_0$ of the high frequency accelerator in an intermediate stage is changed, the high frequency parameters of the high frequency accelerators in the subsequent stages have to be readjusted. On the other hand, in a case of the high frequency accelerator in the most downstream stage, the high frequency accelerator does not exist after that. Accordingly, it is possible to save time for readjusting the high frequency parameter of the high frequency accelerator in the stages other than the most downstream stage.

In S32, in principle, it is preferable that the number of stages of the high frequency accelerators into each of which the difference in the voltage amplitudes $V_0$ is introduced is as large as possible. The change amount or the change rate of the voltage amplitude $V_0$ in each stage can be reduced by increasing the number of stages of the high frequency accelerators into each of which the difference in the voltage amplitudes $V_0$ is introduced. In addition, it is preferable that the change amount or the change rate of the voltage amplitude $V_0$ in each stage is equalized. The change amount or the change rate of the voltage amplitude $V_0$ in each stage can be reduced by equalizing the change amount or the change rate of the voltage amplitude $V_0$ in each stage. The change in the beam transport state in the beam acceleration unit 14 and the change in the beam quality of the ion beam IB output from the beam acceleration unit 14 can be reduced by minimizing the change amount or the change rate of the voltage amplitude $V_0$ in each stage.

In S32, the change amount or the change rate of the voltage amplitude $V_0$ in each stage may not be the same, and may intentionally be not equalized. In addition, when there is a circumstance that the desired difference in the voltage amplitude $V_0$ cannot be introduced, the high frequency accelerator in some stages having such circumstance may be excluded. For example, the circumstance is a case where the changed voltage amplitude $V_0$ exceeds the maximum value of the voltage amplitude $V_0$ that can be set, or falls below the minimum value of the voltage amplitude $V_0$ that can be set, when the difference in the voltage amplitude $V_0$ is introduced. In addition, when the difference in the voltage amplitude $V_0$ is smaller than a minimum change amount of the voltage amplitude $V_0$ that can be set in the high frequency accelerator in each stage, the difference cannot be introduced. In this case, the difference in the voltage amplitude $V_0$ to be introduced may be set to be equal to or larger than the minimum change amount by excluding some stages and reducing the number of stages of the high frequency accelerators into each of which the difference in the voltage amplitude $V_0$ is introduced.

As an example, the high frequency accelerators 102 to 114 from the second stage to the fourteenth stage excluding the most upstream stage and the most downstream stage out of the high frequency accelerators 101 to 115 in fifteen stages are candidates into each of which the difference in the voltage amplitudes $V_0$ is introduced. Based on a value of the beam energy (also referred to as a first output value $E_1$) of the ion beam obtained by the acquired first data set and a value of the target beam energy (also referred to as a second output value $E_2$), the change amount or the change rate of the voltage amplitude $V_0$ in each stage is calculated. For example, when the first output value $E_1$=4 MeV and the second output value $E_2$=4.2 MeV are defined, the energy change amount of the second output value E2 from the first output value $E_1$ is 0.2 MeV, and the energy change rate is 5%. When the change amount of the acceleration or deceleration energy $\Delta E$ in the high frequency accelerator in each stage is the same, the change amount of the acceleration or deceleration energy $\Delta E$ in the high frequency accelerator in each stage is approximately 15.4 KeV. In addition, when the change rate of the acceleration or deceleration energy $\Delta E$ in the high frequency accelerator in each stage is the same, the change rate of the acceleration or deceleration energy $\Delta E$ in the high frequency accelerator in each stage is larger than 5%. When Equation (1) above is used, the change amount or the change rate of the volume amplitude $V_0$ in each stage can be calculated. Accordingly, the change amount or the change rate of the acceleration or deceleration energy $\Delta E$ in the high frequency accelerator in each stage is realized. When there is a stage in which the calculated change amount or the calculated change rate of the voltage amplitude $V_0$ cannot be introduced, for example, such stage is excluded, and the change amounts or the change rates are calculated again. In this way, the difference in the voltage amplitude $V_0$ of the high frequency accelerator in each stage can be determined.

Subsequently, a difference in the phase $\varphi$ introduced into each of the high frequency accelerators 101 to 115 in each stage is calculated (S34). In S34, the difference in the phase $\varphi$ introduced into each stage is calculated so that each of the acceleration phases $\varphi_0$ in all of the high frequency accelerators 101 to 115 respectively in the plurality of stages is the same between the first data set and the second data set. The acceleration phase $\varphi_0$ is a relative phase of the high frequency voltage $V_{RF}$ when the center of the bunched ion particle group 90 passes through the center 84 of the high frequency electrode 72. When the acceleration or deceleration energy $\Delta E$ is changed in at least one of the high frequency accelerators 101 to 129 respectively in the plurality of stages, the speed v of the ion particle group 90 is also changed. Accordingly, a timing at which the center of the ion particle group 90 passes through the center 84 of the high frequency electrode 72 in each stage is changed. Therefore, in order to equalize the relative acceleration phase $\varphi_0$ between the first data set and the second data set, it is necessary to shift the absolute phase $\varphi$ of the high frequency voltage $V_{RF}$ in each stage depending on the passing timing of the center of the ion particle group 90.

In S34, the transport states of the ion particle in the beam acceleration unit 14 operated in accordance with the first data set and the second data set are calculated. Here, the ion particle which is a subject for the calculation is a representative ion particle such as the first ion particle 91 located at the center of the ion particle group 90 bunched by the high frequency accelerator in the most upstream stage. As the transport state of the ion particle, a time at which the ion particle passes through the high frequency accelerator (for example, the center 84 of the high frequency electrode 72) in each stage and the energy of the ion particle passing through the high frequency accelerator (for example, the center 84 of the high frequency electrode 72) in each stage are calculated. First, when the first output value $E_1$ is obtained based on the first data set, a first time at which the ion particle passes through the high frequency accelerator in each stage and first energy of the ion particle passing through the high frequency accelerator in each stage are calculated. The transport state of the ion particle based on the first data set may not be calculated each time, and a calculation result in the past may be used. Subsequently, when the second output value $E_2$ is obtained based on the change amount or the change rate of the acceleration or deceleration energy $\Delta E$ in the high frequency accelerator in each stage which is calculated in S32, a second time at which the ion particle passes through the high frequency accelerator in each stage and second energy of the ion particle passing through the high frequency accelerator in each stage are calculated. Subsequently, based on a time difference $\Delta t$ between the first time and the second time at which the ion particle passes through the high frequency accelerator in each stage and the angular frequency $\omega(=2\pi f)$ of the high frequency accelerator in each stage, a phase difference $\Delta\varphi=\omega\cdot\Delta t$ to be introduced into the high frequency accelerator in each stage is calculated. An absolute phase $\varphi_2\varphi_1+\Delta\varphi$ of the high frequency accelerator in each stage which is defined in the second data set is calculated by introducing the phase difference $\Delta\varphi$ into the absolute phase $\varphi_1$ of the high frequency accelerator in each stage which is defined in the first data set.

Subsequently, the applied voltages of the lens electrodes of the electrostatic quadrupole lens device 120*a*, 120*b*, 120*c*, or 121 to 135 in each stage are calculated (S36). In S36, the applied voltages of the lens electrodes in each stage are calculated so that a focusing/defocusing effect provided for the ion beam IB by the electrostatic quadrupole lens device 120*a*, 120*b*, 120*c*, or 121 to 135 in each stage is the same between the first data set and the second data set. In order to equalize the focusing/defocusing effect of the electrostatic quadrupole lens device in each stage between the first data set and the second data set, it is necessary to change the applied voltage so as to be proportional to a change in the energy of the ion beam IB incident into the electrostatic quadrupole lens device.

In S36, as in S34, the transport states of the ion particle in the beam acceleration unit 14 operated in accordance with the first data set and the second data set are calculated. First, when the first output value $E_1$ is obtained based on the first data set, first incident energy of the ion particle incident into the electrostatic quadrupole lens device in each stage is calculated. The transport state of the ion particle based on the first data set may not be calculated each time, and a calculation result in the past may be used. Subsequently, when the second output value $E_2$ is obtained based on the change amount or the change rate of the acceleration or deceleration energy $\Delta E$ in the high frequency accelerator in each stage which is calculated in S32, second incident energy of the ion particle incident into the electrostatic quadrupole lens device in each stage is calculated. Subsequently, based on a ratio between the first incident energy and the second incident energy in the electrostatic quadrupole lens device in each stage, a change rate of the applied voltage of the electrostatic quadrupole lens device in each stage is calculated. The applied voltage of the electrostatic quadrupole lens device in each stage which is defined in the first data set is multiplied by the calculated change rate. In this manner, the applied voltage of the electrostatic quadrupole lens device in each stage which is defined in the second data set is calculated.

The transport states of the ion particles in S34 and S36 may individually be calculated, or may simultaneously be calculated.

Subsequently, the operation parameters of various devices provided on the downstream side of the beam acceleration unit 14 are calculated (S38). Specifically, the operation parameters for controlling an applied voltage of an electric field application device that applies an electric field to the ion beam ion IB and an applied magnetic field of a magnetic field application device that applies a magnetic field to the ion beam IB are calculated. Examples of the electric field application devices provided on the downstream side of the beam acceleration unit 14 include the horizontally focusing quadrupole lens 26, the beam shaper 32, the beam scanner 34, the beam parallelizer 36, and the final energy filter 38. Examples of the magnetic field application devices provided on the downstream side of the beam acceleration unit 14 include the energy analysis electromagnet 24 and the bending electromagnet 30.

In the electric field application device, a value of the applied voltage is set so that an effect of the electric field applied to the ion beam IB is the same between the first data set and the second data set. In order to equalize the effect of the electric field applied to the ion beam IB by the electric field application device, it is necessary to change the value of the applied voltage so as to be proportional to the energy of the ion beam IB. Therefore, in the electric field application device, the value of the applied voltage should be changed to be a value obtained by multiplying by a ratio $E_2/E_1$ between the first output value $E_1$ and the second output value $E_2$.

In the magnetic field application device, a value of the applied magnetic field is similarly set so that an effect of the magnetic field applied to the ion beam IB is the same between the first data set and the second data set. In order to equalize the effect of the magnetic field applied to the ion beam IB by the magnetic field application device, it is necessary to change the value of the applied magnetic field so as to be proportional to a square root of the energy of the ion beam IB. Therefore, in the magnetic field application device, the value of the applied magnetic field should be changed to be a value obtained by multiplying by a square root of the ratio $E_2/E_1$ between the first output value $E_1$ and the second output value $E_2$.

Finally, a set of the operation parameters calculated in S32 to S38 is determined and stored as the second data set (S40). Thereafter, a wafer is irradiated with the ion beam IB generated in accordance with the determined second data set, and the ion implantation process is performed. In the second adjustment method, the second data set can be determined only by calculation without measuring the beam characteristics of the ion beam IB. Accordingly, in the second adjustment method, the data set can more quickly be determined, compared to the first adjustment method. An example of the beam characteristics of the ion beam IB for which the measurement can be skipped in the second adjustment method is the beam energy, the beam current, beam size, the beam parallelism, or the beam angle.

The second data set is determined based on the existing first data set. Accordingly, the manufacturing error and the assembling error of the high frequency electrode 72, and the errors of the amplitude, the frequency and the phase of the high frequency voltage $V_{RF}$ applied to the high frequency electrode 72 are already taken into account. In addition, in the second data set, the operation parameters are calculated so that the beam quality equivalent to that for the first data set can be obtained. Accordingly, by using the second data set, it is possible to generate the ion beam IB in which only the beam energy is changed without substantially changing the beam quality.

Figure 11:
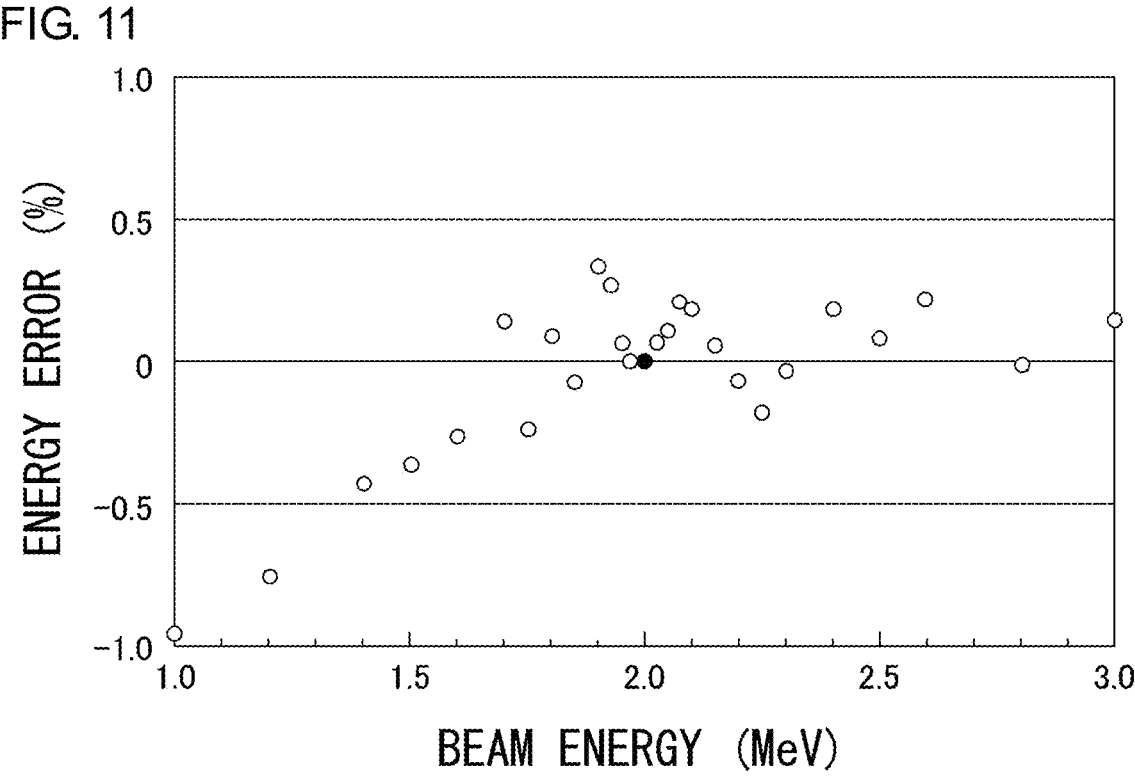
FIG. 11 is a graph illustrating an example of errors in energy of ion beams obtained by second data sets.

FIG. 11 is a graph illustrating an example of errors of the energy of the ion beams IBs which are obtained by the second data sets. In the example in FIG. 11, the second data sets are generated, based on the first data set for obtaining the ion beam IB of 2 MeV, and the second output values $E_2$ are changed in a range of 1 MeV to 3 MeV. That is, the second output values $E_2$ are changed in a range of ±50% with reference to the first output value $E_1$=2 MeV of the existing first data set. As illustrated, even when the beam energy is changed in the range of ±50%, the beam energy can accurately be adjusted in a range of −1% to +0.5%. In addition, in a range of 1.5 MeV to 3 MeV, the beam energy can accurately be adjusted within ±0.5%.

In addition, instead of using the second data set determined only by calculation without any modification, at least one of the operation parameters defined in the second data set may be adjusted, based on at least one measurement value of the beam characteristics. For example, the beam energy of the ion beam IB output from the beam acceleration unit 14 operated in accordance with the second data set may be measured, and the voltage amplitude of the high frequency accelerator in at least one of the plurality of stages may be adjusted, based on the measurement value of the beam energy. For example, the voltage amplitude of the high frequency accelerator 115 in the most downstream stage may be changed so that a difference between the measurement value and the target value of the beam energy falls within an allowable range most downstream. As a result, for example, the beam energy can accurately be adjusted within ±0.1%.

Figure 12:
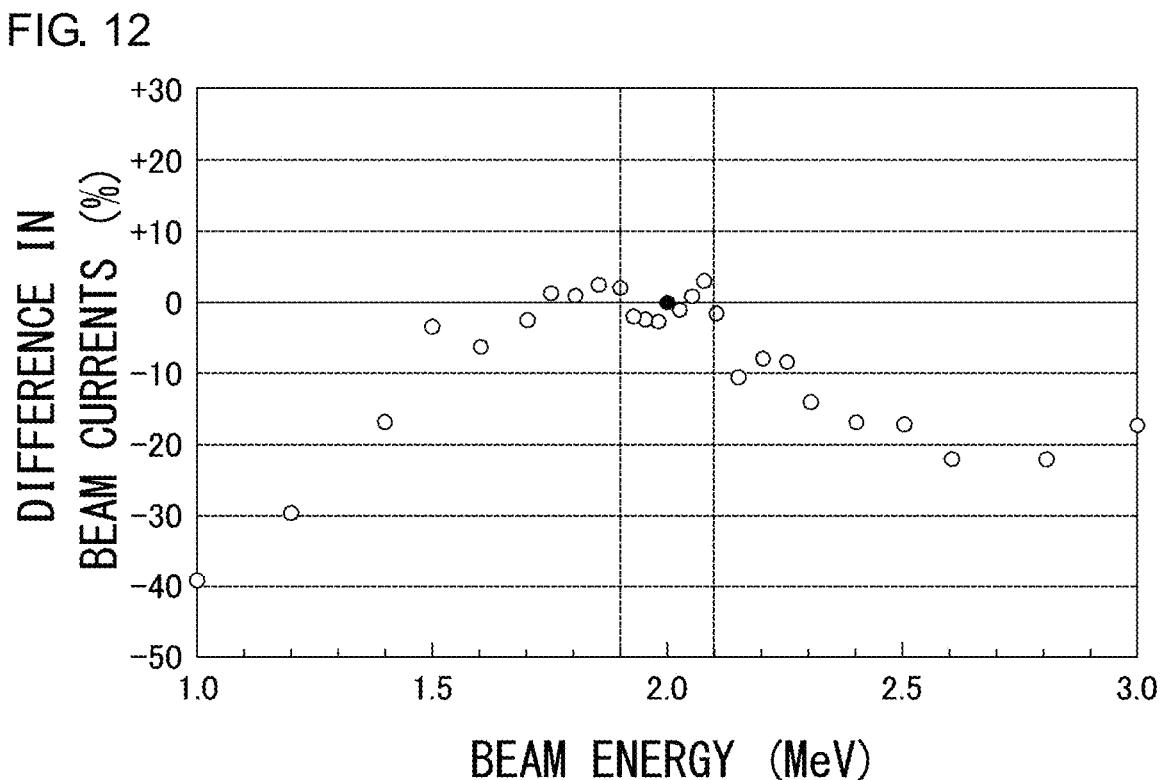
FIG. 12 is a graph illustrating changes in beam currents of the ion beams obtained by the second data sets.

FIG. 12 is a graph illustrating an example of differences in the beam currents between the ion beam IB obtained by the first data set and the ion beam IBs obtained by the second data sets. As in FIG. 11, the second data sets are generated, based on the first data set for which the ion beam IB of 2 MeV is obtained, and the second output values $E_2$ are changed in a range of 1 MeV to 3 MeV. As illustrated, even when the beam energy is changed in a range of 1.5 MeV to 2.5 MeV, that is, in a range of ±25%, the differences in the beam currents can fall within a range of −20% to ±5%. In addition, when the beam energy is changed in a range of ±5%, the differences in the beam currents can fall within ±5%. For this reason, the beam energy can be changed in the range of ±5% without any additional adjustment while the transport state of the beam is equivalently maintained.

A plurality of the second data sets may be generated from the existing first data set by using the second adjustment method described above. The plurality of second data sets may be generated to obtain a plurality of mutually different second output values. For example, the plurality of second data sets may be generated to respectively obtain each of the plurality of ion beams IBs having the beam energy of 1.9 MeV, 1.95 MeV, 2.05 MeV, and 2.1 MeV from the first data set for which the ion beam IB having the beam energy of 2 MeV is obtained. Each of the plurality of second data sets may be used for the ion implantation process without adjustment based on the measurement value of at least one of the beam characteristics. Each of the plurality of second data sets may be used for the ion implantation process without measuring at least one of the beam characteristics. That is, with regard to each of the plurality of ion beams, the measurement of at least one of the beam characteristics may be skipped, and multiple implantation may be performed.

The plurality of second data sets may be used for the multiple implantation in which the same wafer is irradiated with the plurality of ion beams having mutually different beam energy. For example, the same wafer may sequentially be irradiated with the plurality of ion beams having mutually different beam energy by sequentially switching the plurality of second data sets. In addition, the same wafer may sequentially be irradiated with the plurality of ion beams having mutually different beam energy by sequentially switching the first data set and the plurality of second data sets. For example, the same wafer may sequentially be irradiated with the plurality of ion beams having the beam energy of 1.9 MeV to 2.1 MeV at intervals of 0.05 MeV.

A plurality of first data sets for respectively obtaining a plurality of ion beams having mutually different beam energy may be prepared in advance so that the beam energy can be arbitrarily selected over a wide energy range. When the ion beam having the beam energy different from specific beam energy of the ion beams obtained by the plurality of first data sets is required, the second data set may be generated, based on any one of the plurality of first data sets. For example, when the plurality of first data sets for respectively obtaining the plurality of ion beams having a plurality of beam energy changed at intervals of 10% are prepared, the second data set for obtaining the ion beam having any desired beam energy can be generated by changing the beam energy in a range of ±5%. Furthermore, when the plurality of first data sets corresponding to the plurality of beam conditions having mutually different combinations of conditions such as an ion species, an ion charge state, and a beam current are prepared, the second data set corresponding to any desired beam condition can quickly be generated.

The second data set may be used so that the beam energy of the ion beam with which the wafer is irradiated is finely adjusted for each of the wafers in accordance with an individual difference in each of the wafers. For example, based on the plurality of first data sets for multiple implantation, the plurality of second data sets may be generated to respectively obtain the plurality of ion beams having slightly changed beam energy. As an example, when the plurality of ion beams having the beam energy in a range of 1 MeV to 4 MeV at intervals of 0.5 MeV are implanted into the same wafer as the multiple implantation, the plurality of first data sets are prepared to respectively obtain the plurality of ion beams having the beam energy of 1 MeV, 1.5 MeV, 2 MeV, 2.5 MeV, 3.5 MeV, and 4 MeV. A first wafer is sequentially irradiated with the plurality of ion beams obtained by the plurality of first data sets. In some cases, a second wafer different from the first wafer may require the multiple implantation with the plurality of ion beams having the beam energy slightly (for example, +0.05 MeV) different from those of the ion beams implanted into the first wafer. In this case, based on the plurality of first data sets, the plurality of second data sets for respectively obtaining the plurality of ion beams having the beam energy of 1.05 MeV, 1.55 MeV, 2.05 MeV, 2.55 MeV, 3.05 MeV, 3.55 MeV, and 4.05 MeV can be generated only by calculation. The second wafer is sequentially irradiated with the plurality of ion beams obtained by the plurality of generated second data sets. The second data sets are used for the multiple implantation. Accordingly, a time required for generating the data sets can be significantly shortened, and productivity of the ion implanter 100 can be improved. In addition, the beam energy can finely be adjusted in a short time. Therefore, the beam energy can finely be changed for lot-to-lot or wafer-to-wafer without significantly degrading the productivity, and a product yield can be improved.

According to an example of the present embodiment, the voltage amplitudes $V_0$ of the high frequency accelerators respectively in the plurality of stages are collectively changed. In this manner, compared to a case of changing only the voltage amplitude $V_0$ of the high frequency accelerator in one stage, an adjustment range of the beam energy can be widened. In addition, as long as the beam energy is within a predetermined adjustment range, without substantially changing the beam transport state, only the beam energy can be adjusted in a wider range, compared to the related art. As a result, it is extremely easy to perform the ion implantation process using the ion beams having various beam energy.

Hitherto, the present invention has been described with reference to the above-described respective embodiments. However, the present invention is not limited to the above-described respective embodiments. Those in which configurations of the respective embodiments are appropriately combined or replaced with each other are also included in the present invention. Based on the knowledge of those skilled in the art, the respective embodiments can be combined with each other, the processing sequences can be appropriately rearranged, or various modifications such as design changes can be added to the embodiment. The embodiment having the added modifications can also be included in the scope of the present invention.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
a high energy multi-stage linear acceleration unit including a plurality of linear acceleration units, wherein each of the linear acceleration units includes high frequency accelerators respectively in a plurality of stages; and
a control device controlling an operation of the high energy multi-stage linear acceleration unit in accordance with a data set defining a voltage amplitude, a frequency, and a phase of the high frequency accelerator in each of the plurality of stages,
wherein the control device is configured to
acquire a first data set for setting beam energy of an ion beam output from the high energy multi-stage linear acceleration unit to be a first output value,
determine a second data set for setting the beam energy of the ion beam output from the high energy multi-stage linear acceleration unit to be a second output value different from the first output value, based on the first data set, and
operate the high energy multi-stage linear acceleration unit in accordance with the determined second data set, and the control device determines the second data set so that an acceleration phase of the high frequency accelerator in each of the plurality of stages in at least one linear acceleration unit of the plurality of linear acceleration units is the same between the first data set and the second data set, in all of the high frequency accelerators respectively in the plurality of stages, and so that the voltage amplitude of the high frequency accelerator in at least one of the plurality of stages is different between the first data set and the second data set.

2. The ion implanter according to claim 1,
wherein the voltage amplitude of the high frequency accelerator in at least one stage other than an most upstream stage and a most downstream stages is different between the first data set and the second data set.

3. The ion implanter according to claim 1,
wherein each of the voltage amplitudes of the high frequency accelerators in two or more of the plurality of stages is different between the first data set and the second data set.

4. The ion implanter according to claim 3,
wherein each of the voltage amplitudes of the high frequency accelerators in at least half of the plurality of stages is different between the first data set and the second data set.

5. The ion implanter according to claim 3,
wherein in the high frequency accelerators in the two or more of the plurality of stages in each of which the voltage amplitude of the high frequency accelerator is different between the first data set and the second data set, a change amount between the first data set and the second data set of the voltage amplitude of the high frequency accelerator in each of the two or more of the plurality of stages is the same.

6. The ion implanter according to claim 3,
wherein in the high frequency accelerators in the two or more of the plurality of stages in each of which the voltage amplitude of the high frequency accelerator is different between the first data set and the second data set, a change rate between the first data set and the second data set of the voltage amplitude of the high frequency accelerator in each of the two or more of the plurality of stages is the same.

7. The ion implanter according to claim 1, wherein the control device is further configured to:
determine the high frequency accelerator in at least one of the plurality of stages into which a difference between the first data set and the second data set in the voltage amplitude of the high frequency accelerator is to be introduced, based on a difference between the first output value and the second output value.

8. The ion implanter according to claim 1, wherein the control device is further configured to:
determine the high frequency accelerator in at least one of the plurality of stages into which a difference between the first data set and the second data set in the voltage amplitude of the high frequency accelerator is to be introduced, based on a difference between a maximum value of the voltage amplitude settable in the high frequency accelerator in each of the plurality of stages, and the voltage amplitude of the high frequency accelerator in each of the plurality of stages which is defined in the first data set.

9. The ion implanter according to claim 1, wherein the control device is further configured to:
determine the high frequency accelerator in at least one of the plurality of stages into which a difference between the first data set and second data set in the voltage amplitude of the high frequency accelerator is to be introduced, based on a minimum change amount of the voltage amplitude settable in the high frequency accelerator in each of the plurality of stages.

10. The ion implanter according to claim 1, wherein the first data set is determined by adjusting the acceleration phase of the high frequency accelerator in at least one of the plurality of stages, based on a measurement value of at least one beam characteristic of the ion beam output from the high energy multi-stage linear acceleration unit, and
the second data set is determined by adjusting the voltage amplitude of the high frequency accelerator in at least one of the plurality of stages, based on a transport simulation of the ion beam by the high energy multi-stage linear acceleration unit.

11. The ion implanter according to claim 1, wherein the ion implantation is performed with skipping measurement of at least one beam characteristic of the ion beam output from the high energy multi-stage linear acceleration unit operating in accordance with the second data set.

12. The ion implanter according to claim 1, wherein the control device is further configured to:
measure at least one beam characteristic of the ion beam output from the high energy multi-stage linear acceleration unit operating in accordance with the second data set; and
adjust the voltage amplitude of the high frequency accelerator in at least one of the plurality of stages which is defined in the second data set, based on a measurement value of the at least one beam characteristic.

13. The ion implanter according to claim 1, wherein the control device is further configured to:
calculate a first timing at which an ion particle transported by the high energy multi-stage linear acceleration unit operating in accordance with the first data set passes through the high frequency accelerator in each of the plurality of stages, and first passing energy of the ion particle when the ion particle passes through the high frequency accelerator in each of the plurality of stages;
calculate the acceleration phase of the high frequency accelerator in each of the plurality of stages, based on the calculated first timing and the calculated first passing energy;
calculate a second timing at which the ion particle passes through the high frequency accelerator in each of the plurality of stages when the voltage amplitude of the high frequency accelerator in at least one of the plurality of stages is changed while the calculated acceleration phase of the high frequency accelerator in each of the plurality of stages is fixed, and second passing energy of the ion particle when the ion particle passes through the high frequency accelerator in each of the plurality of stages; and
determine the phase of the high frequency accelerator in each of the plurality of stages which is defined in the second data set, based on the phase of the high frequency accelerator in each of the plurality of stages which is defined in the first data set, and a phase difference between the first timing and the second timing at which the ion particle passes through the high frequency accelerator in each of the plurality of stages.

14. The ion implanter according to claim 1, wherein each of the linear acceleration units includes electrostatic quadrupole lens devices respectively in a plurality of stages, the electrostatic quadrupole lens device in each of the plurality of stages is disposed on a downstream side of the corresponding high frequency accelerator in each of the plurality of stages, and the data set further defines an applied voltage of the electrostatic quadrupole lens device in each of the plurality of stages, and
the control device is further configured to:
calculate first incident energy of an ion particle transported by the high energy multi-stage linear acceleration unit operating in accordance with the first data set when the ion particle is incident into the electrostatic quadrupole lens device in each of the plurality of stages;
calculate second incident energy of the ion particle transported by the high energy multi-stage linear acceleration unit operating in accordance with the second data set when the ion particle is incident into the electrostatic quadrupole lens device in each of the plurality of stages; and
determine the applied voltage of the electrostatic quadrupole lens device in each of the plurality of stages which is defined in the second data set, based on the applied voltage of the electrostatic quadrupole lens device in each of the plurality of stages which is defined in the first data set, and the first incident energy and the second incident energy of the ion particle when the ion particle is incident into the electrostatic quadrupole lens device in each of the plurality of stages.

15. The ion implanter according to claim 14, wherein the applied voltage of the electrostatic quadrupole lens device in each of the plurality of stages which is defined in the second data set is a value obtained by multiplying the applied voltage of the electrostatic quadrupole lens device in each of the plurality of stages which is defined in the first data set by a ratio between the first incident energy and the second incident energy of the ion particle when the ion particle is incident into the electrostatic quadrupole lens device in each of the plurality of stages.

16. The ion implanter according to claim 1, wherein the ion implanter further includes an electric field application device disposed on a downstream side of the high energy multi-stage linear acceleration unit, and applying an electric field to the ion beam output from the high energy multi-stage linear acceleration unit, and the data set further defines an applied voltage of the electric field application device, and
the control device is further configured to:
determine the applied voltage of the electric field application device which is defined in the second data set, based on the applied voltage of the electric field application device which is defined in the first data set, and the first output value and the second output value of the beam energy of the ion beam output from the high energy multi-stage linear acceleration unit.

17. The ion implanter according to claim 16, wherein the applied voltage of the electric field application device which is defined in the second data set is a value obtained by multiplying the applied voltage of the electric field application device which is defined in the first data set by a ratio between the first output value and the second output value.

18. The ion implanter according to claim 1, wherein the ion implanter further includes a magnetic field application device disposed on a downstream side of the high energy multi-stage linear acceleration unit, and applying a magnetic field to the ion beam output from the high energy multi-stage linear acceleration unit, and the data set further defines an applied magnetic field of the magnetic field application device, and the control device is further configured to:

determine the applied magnetic field of the magnetic field application device which is defined in the second data set, based on the applied magnetic field of the magnetic field application device which is defined in the first data set, and the first output value and the second output value of the beam energy of the ion beam output from the high energy multi-stage linear acceleration unit.

19. The ion implanter according to claim 18, wherein the applied magnetic field of the magnetic field application device which is defined in the second data set is a value obtained by multiplying the applied magnetic field of the magnetic field application device which is defined in the first data set by a square root of a ratio between the first output value and the second output value.

20. The ion implanter according to claim 1, wherein the control device is further configured to:

determine a plurality of the second data sets for setting the beam energy of the ion beam output from the high energy multi-stage linear acceleration unit to be a plurality of the second output values different from the first output value, based on the first data set, wherein the acceleration phase of the high frequency accelerator in each of the plurality of stages is the same between the first data set and each of the plurality of second data sets, in all of the high frequency accelerators respectively in the plurality of stages, the voltage amplitude of the high frequency accelerator in at least one of the plurality of stages is different between the first data set and each of the plurality of second data sets, and the plurality of second data sets are switched therebetween to perform the ion implantations by sequentially irradiating the workpiece with a plurality of the ion beams output from the high energy multi-stage linear acceleration unit operating in accordance with the plurality of second data sets.

21. The ion implanter according to claim 20, wherein measurement of at least one beam characteristic is skipped for each of the plurality of ion beams.

\* \* \* \* \*